(12) United States Patent
Chang et al.

(10) Patent No.: US 12,191,203 B2
(45) Date of Patent: Jan. 7, 2025

(54) SEMICONDUCTOR PACKAGE

(71) Applicant: Taiwan Semiconductor Manufacturing Company, Ltd., Hsinchu (TW)

(72) Inventors: Wei-Chung Chang, Hsinchu (TW); Ming-Che Ho, Tainan (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/395,706

(22) Filed: Dec. 25, 2023

(65) Prior Publication Data
US 2024/0128122 A1    Apr. 18, 2024

Related U.S. Application Data

(62) Division of application No. 17/460,317, filed on Aug. 30, 2021, now Pat. No. 11,901,230.

(51) Int. Cl.
*H01L 21/768*    (2006.01)
*H01L 23/48*    (2006.01)
(Continued)

(52) U.S. Cl.
CPC .. *H01L 21/76898* (2013.01); *H01L 21/76804* (2013.01); *H01L 21/76846* (2013.01);
(Continued)

(58) Field of Classification Search
CPC ....... H01L 23/00; H01L 23/48; H01L 23/481; H01L 23/498; H01L 23/538; H01L 23/5383; H01L 23/5389; H01L 23/49816; H01L 23/49822; H01L 23/5384; H01L 21/48; H01L 21/56; H01L 21/486; H01L 21/561; H01L 21/568; H01L 21/683;
(Continued)

(56) References Cited

U.S. PATENT DOCUMENTS 8,993,380 B2    3/2015   Hou et al.
9,281,254 B2    3/2016   Yu et al.
(Continued)

*Primary Examiner* — Chuong A Luu
(74) *Attorney, Agent, or Firm* — JCIPRNET

(57) ABSTRACT

Semiconductor package includes substrate, first barrier layer, second barrier layer, routing via, first routing pattern, second routing pattern, semiconductor die. Substrate has through hole with tapered profile, wider at frontside surface than at backside surface of substrate. First barrier layer extends on backside surface. Second barrier layer extends along sidewalls of through hole and on frontside surface. Routing via fills through hole and is separated from sidewalls of through hole by at least second barrier layer. First routing pattern extends over first barrier layer on backside surface and over routing via. First routing pattern is electrically connected to end of routing via and has protrusion protruding towards end of routing via in correspondence of through hole. Second routing pattern extends over second barrier layer on frontside surface. Second routing pattern directly contacts another end of routing via. Semiconductor die is electrically connected to routing via by first routing pattern.

7 Claims, 38 Drawing Sheets

(51) Int. Cl.
*H01L 25/10* (2006.01)
*H01L 23/498* (2006.01)

(52) U.S. Cl.
CPC ...... *H01L 21/76871* (2013.01); *H01L 23/481* (2013.01); *H01L 25/105* (2013.01); *H01L 23/49816* (2013.01); *H01L 23/49822* (2013.01); *H01L 23/49838* (2013.01); *H01L 2225/1041* (2013.01)

(58) Field of Classification Search
CPC ............... H01L 21/768; H01L 21/6835; H01L 21/76804; H01L 21/76846; H01L 21/76871; H01L 21/76898; H01L 25/10; H01L 25/16; H01L 25/50; H01L 25/105; H01L 25/0657; H01L 24/19; H01L 24/20; H01L 2225/1041; H01L 2225/06527; H01L 2221/68345; H01L 2221/68359; H01L 2221/68372

USPC .......................................................... 257/774
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2012/0261805 A1* | 10/2012 | Sundaram | H01L 23/49827 257/E21.597 |
| 2013/0075921 A1* | 3/2013 | Chen | H01L 23/49827 257/E23.067 |
| 2013/0244378 A1* | 9/2013 | Kao | H01L 21/563 438/118 |

* cited by examiner

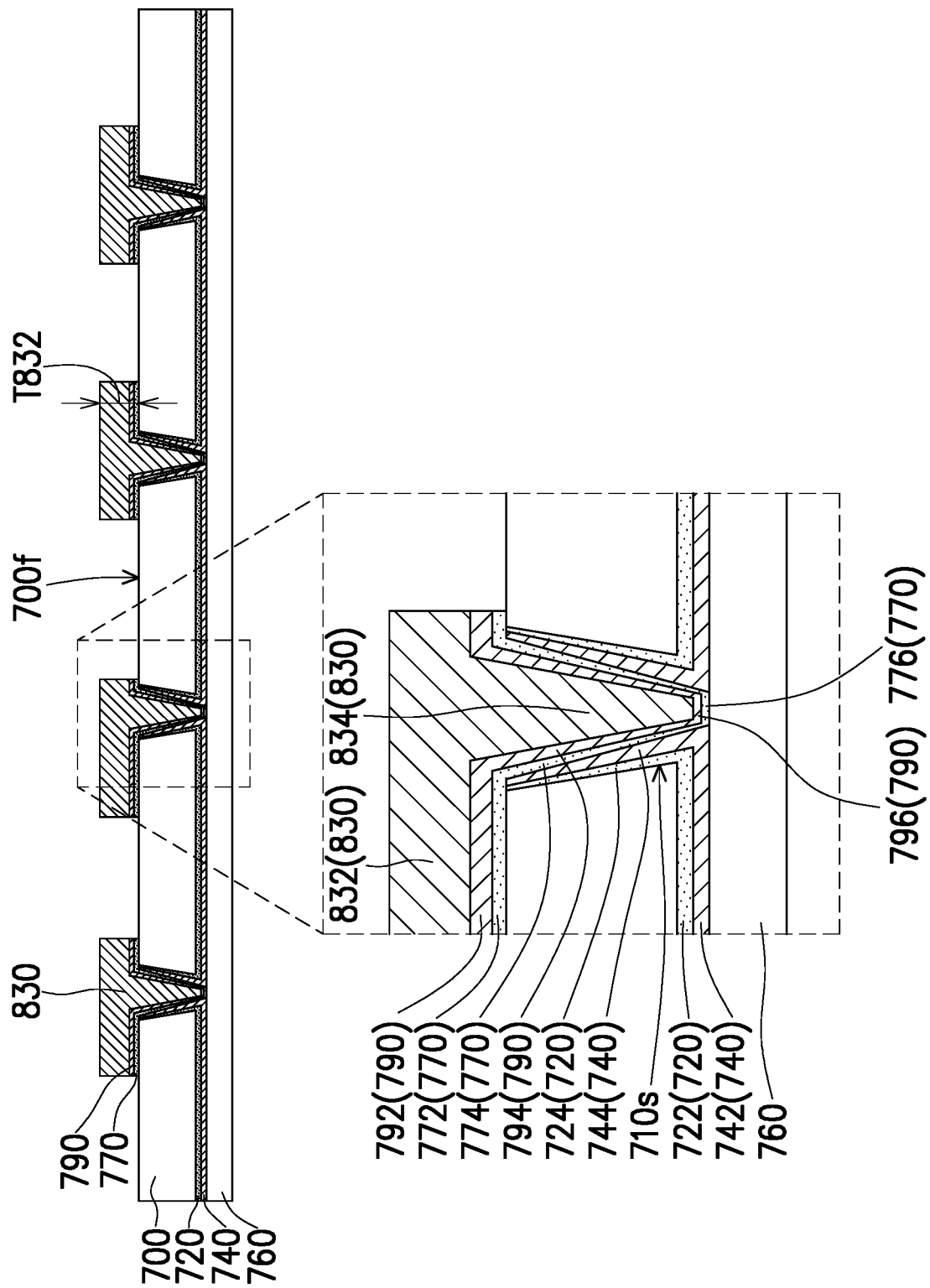

SEMICONDUCTOR PACKAGE

CROSS-REFERENCE TO RELATED APPLICATION

This is a divisional application of and claims the priority benefit of U.S. application Ser. No. 17/460,317, filed on Aug. 30, 2021, now allowed. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5M are schematic cross-sectional views illustrating structures formed during a manufacturing process of a semiconductor package according to some embodiments of the disclosure.

DETAILED DESCRIPTION

Figure 1:
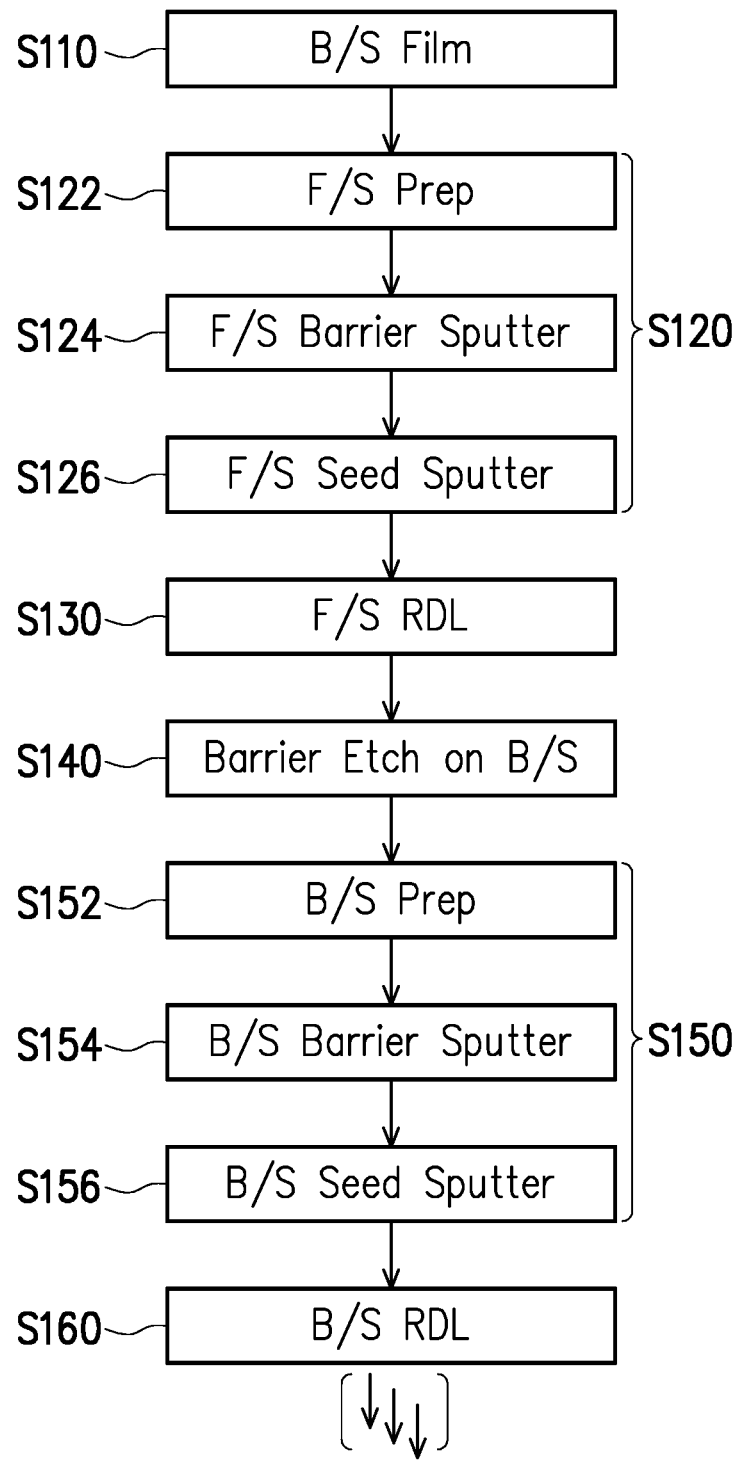
FIG. 1 is a schematic flow chart illustrating some steps of a manufacturing method of a semiconductor package according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
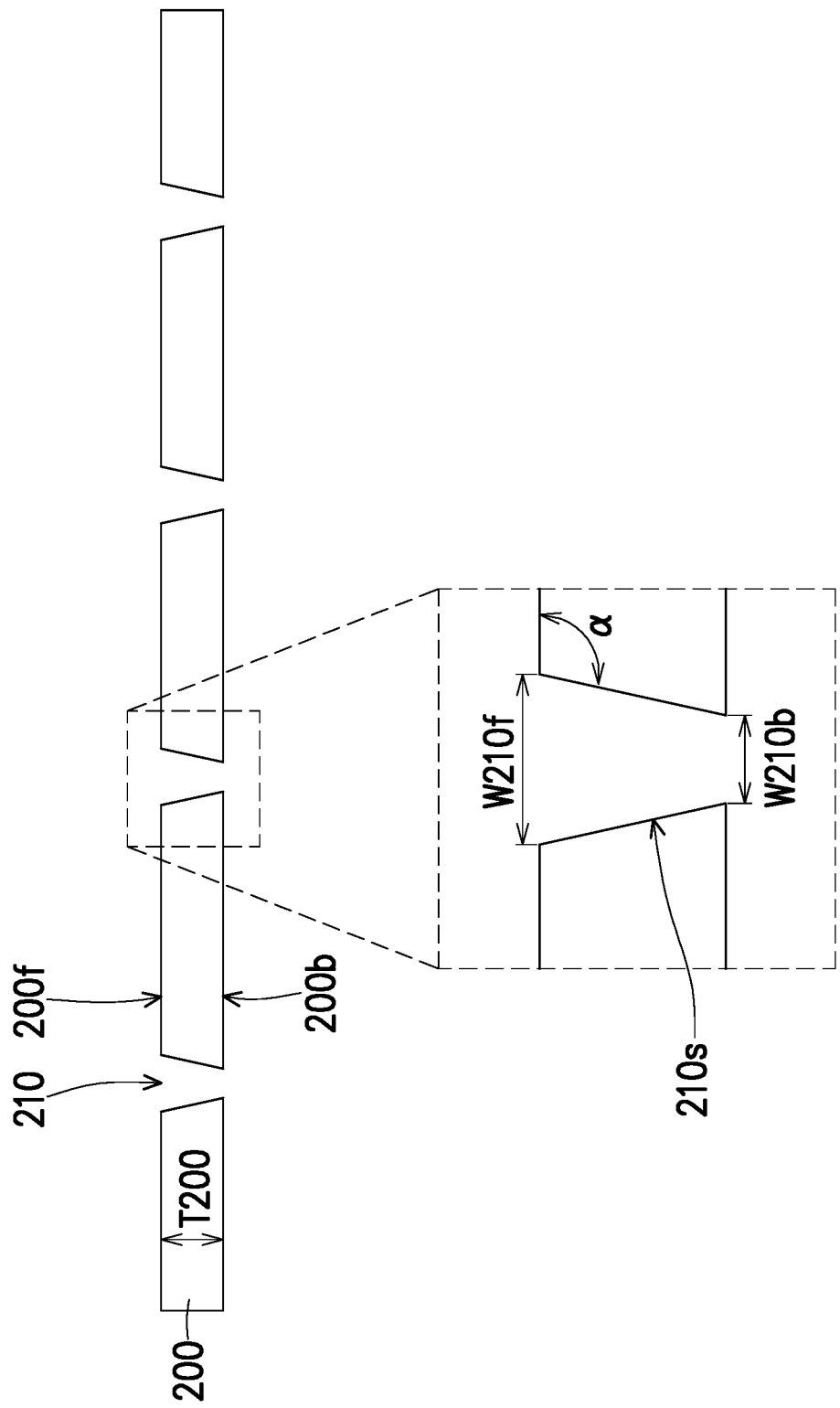
FIG. 2A to FIG. 2U are schematic cross-sectional views illustrating structures formed during a manufacturing process of a semiconductor package according to some embodiments of the disclosure.

FIG. 1 is a schematic flow chart illustrating some steps of a manufacturing method of a semiconductor package SP10 according to some embodiments of the disclosure. FIG. 2A to FIG. 2U are schematic cross-sectional views illustrating structures formed during a manufacturing process of the semiconductor package SP10 according to some embodiments of the disclosure. In FIG. 2A, a substrate 200 (e.g., an interposer) is provided. In some embodiments, the substrate 200 is a wafer of an inorganic material. For example, the substrate 200 may be a wafer including a ceramic material. Examples of ceramic materials include metal oxides such as binary oxides (e.g., silicon oxide, barium oxide, aluminum oxide, zirconium oxide, beryllium oxide, zinc oxide, neodymium oxide, etc.) as well as ternary or higher oxides (e.g., titanates, aluminates, silicates, doped metal oxides, etc.), nitrides (e.g., silicon nitride, aluminum nitride, etc.), carbides (e.g., silicon carbides), etc. These materials may be used alone, or in combinations of two or more. In some embodiments, the substrate 200 includes aluminum nitride.

In some embodiments, through holes 210 are formed in the substrate 200, extending all the way from the frontside surface 200f of the substrate 200 to the opposite backside surface 200b, for the entire thickness T200 of the substrate 200. In some embodiments, the through holes 210 are formed by laser drilling. For example, the material of the substrate 200 may be ablated by firing a laser towards the substrate 200 in the intended locations of the through holes 210 from the side of the frontside surface 200f. This may result in the through holes 210 having tapered sidewalls 210s, so that a width W210f of the through holes 210 at the frontside surface 200f of the substrate 200 is greater than a width W210b of the through holes 210 at the backside surface 200b of the substrate 200. Alternatively stated, the through holes 210 may become narrower proceeding from the frontside surface 200f towards the backside surface 200b along the thickness direction of the substrate 200. The tapering angle α defined by the frontside surface 200f of the substrate 200 and the sidewalls 210s of the through holes 210 may be greater than 90 degrees, for example in the range between 90 degrees and 120 degrees.

Figure 2B:
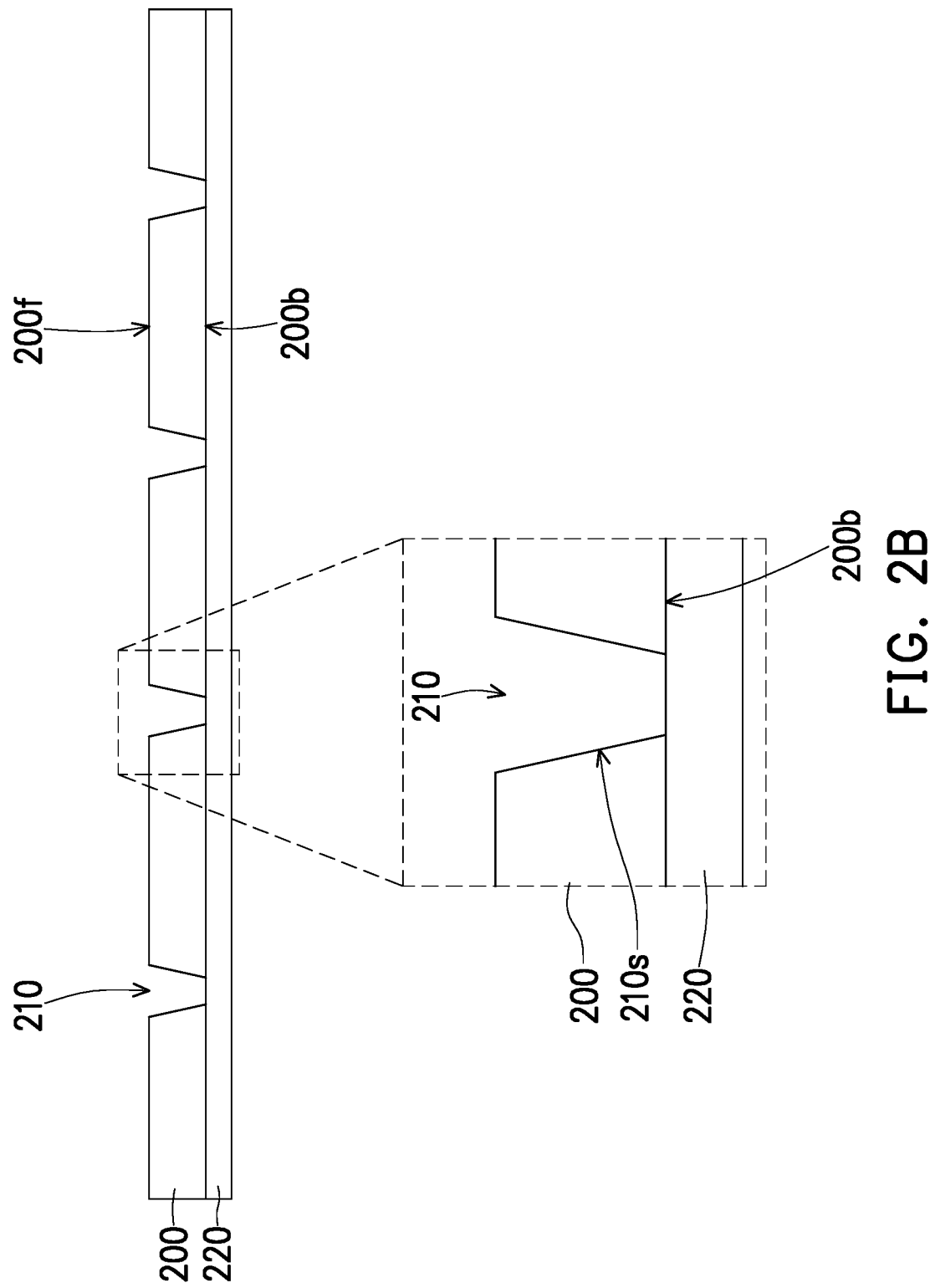

In FIG. 2B, a backside film 220 is bonded to the backside surface 200b of the substrate (step S110 in FIG. 1). The backside film 220 may be or include an organic material, such as an adhesive tape, an organic polymer (e.g., polyimide, epoxy, etc.), a dry photoresist or the like, which is disposed on the substrate 200. In some embodiments, the backside film 220 may include fillers. For example, the backside film may include an epoxy resin with fillers dispersed therein. In some alternative embodiments, the backside film 220 may be a carrier (e.g., a glass carrier) which is removably attached to the substrate 200, for example via a de-bonding layer. In some embodiments, the backside film 220 may be removed, when required, via suitable removal processes such as by irradiation of the de-bonding layer (e.g., in case of LTHC materials), etching (e.g., plasma etching, chemical etching, etc.), or the like. The backside film 220 may cover most or all of the backside surface 200b. Most notably, the backside film 220 extends at the bottom of the through holes 210, so that the through holes 210 are plugged at the side of the backside surface 200b. That is, the through holes 210 may in fact appear as blind holes by way of the backside film 220.

In some embodiments, the substrate 200 with the backside film 220 bonded thereto is introduced in a sputtering chamber to perform a sputtering process from the side of the frontside surface 200f (step S120 in FIG. 1). In some embodiments, the sputtering process S120 includes a surface preparation step S122, a barrier layer sputtering step S124 and a seed layer sputtering step S126. In the preparation step S122, the frontside surface 200f and the sidewalls 210s of the through holes 210 are pre-treated for subsequent material deposition. In some embodiments, a cleaning step, for example via plasma treatment, is performed to remove impurities which may have deposited or otherwise formed on the frontside surface 200f and the sidewalls 210s. After cleaning, the sputtering chamber may be brought to the target temperature and pressure for the subsequent sputtering operations.

Figure 2C:
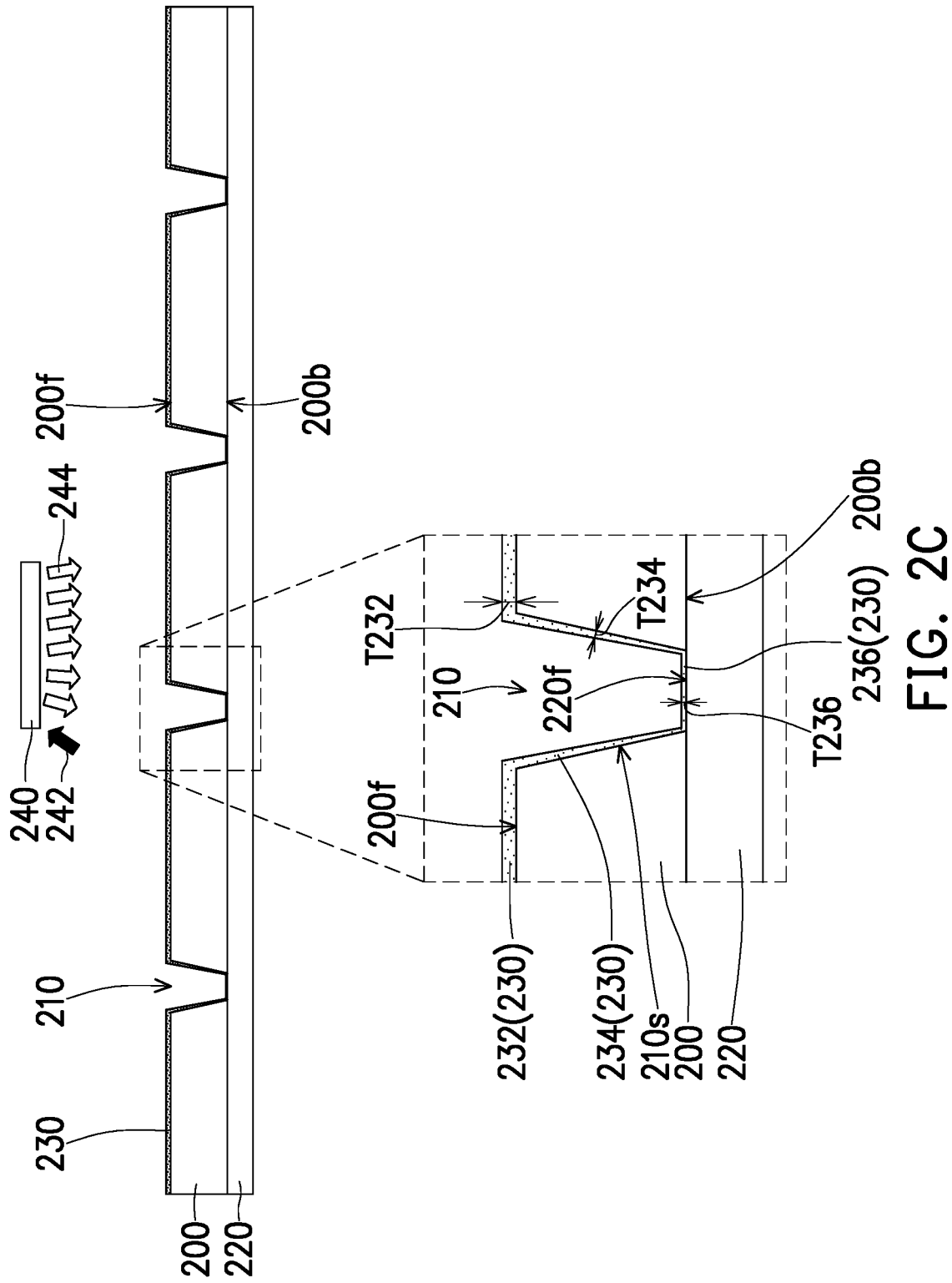

In FIG. 2C, the material of a frontside barrier layer 230 is sputtered on the frontside surface 200f of the substrate 200 and the sidewalls 210s of the through holes 210 (step S124 in FIG. 1). For example, one or more sputtering targets 240 are hit with high energy incident atoms or ions 242 to eject sputtered material 244 which is then deposited on the substrate 200. In some embodiments, the pressure of the sputtering chamber and the energy of the incident atoms or ions 242 are selected so that the mean free path of the sputtered material 244 is sufficiently long to form the frontside barrier layer 230 also on the backside film 220 at the bottom of the through holes 210. It should be noted that while a single target 240 is illustrated in FIG. 2C, the disclosure is not limited thereto. For example, depending on the desired composition of the frontside barrier layer 230, multiple sputtering targets 240 may be used. In some embodiments, the frontside barrier layer 230 includes a metallic material, such as titanium, tantalum, a nitride thereof, or a combination thereof. In some embodiments, the frontside barrier layer 230 is a titanium-containing layer, including a titanium-based material such as titanium, titanium nitride, or a combination thereof. In some embodiments, the frontside barrier layer 230 is a tantalum-containing layer, including a tantalum-based material such as tantalum, tantalum nitride, or a combination thereof.

In some embodiments, the sputtered material 244 reaches the substrate 200 from the side of the frontside surface 200f. The resulting frontside barrier layer 230 may thus include sections 232 extending on the frontside surface 200f of the substrate 200, sections 234 extending on the sidewalls 210s of the through holes 210, and sections 236 extending at the bottom of the through holes 210 on the frontside surface 220f of the backside film 220. In some embodiments, the thicknesses T232, T234, T236 of the individual sections 232, 234, 236 of the frontside barrier layer 230 may become increasingly smaller proceeding from the frontside surface 200f to the backside surface 200b. The thicknesses T232, T234, T236 may be measured along directions normal to the surfaces 200f, 210s, 220f on which the corresponding sections 232, 234, 236 of the frontside barrier layer 230 extend. So, for example, the thicknesses T232, T236 may be measured along a direction normal to the frontside surface 200f, and the thickness T234 may be measured along a direction normal to the sidewalls 210s. The sections 232 located on the frontside surface 200f may have a substantially constant thickness T232 and the sections 234 located on the sidewalls 210s of the through holes 210 may have a decreasing thickness T234 proceeding towards the backside surface 200b. The sections 236 at the bottom of the through holes 210 may have a thickness T236 comparable to the thickness T234 of the sections 234 in proximity of the backside surface 200b. In some embodiments, the thickness T236 of the sections 236 may be slightly larger towards the center of the through holes 210 than closer to the sidewalls 210s. In some embodiments, the frontside barrier layer 230 is formed to have a thickness T232 in the range from 0.5 micrometers to 10 micrometers, such as of about 2 micrometers.

Figure 2D:
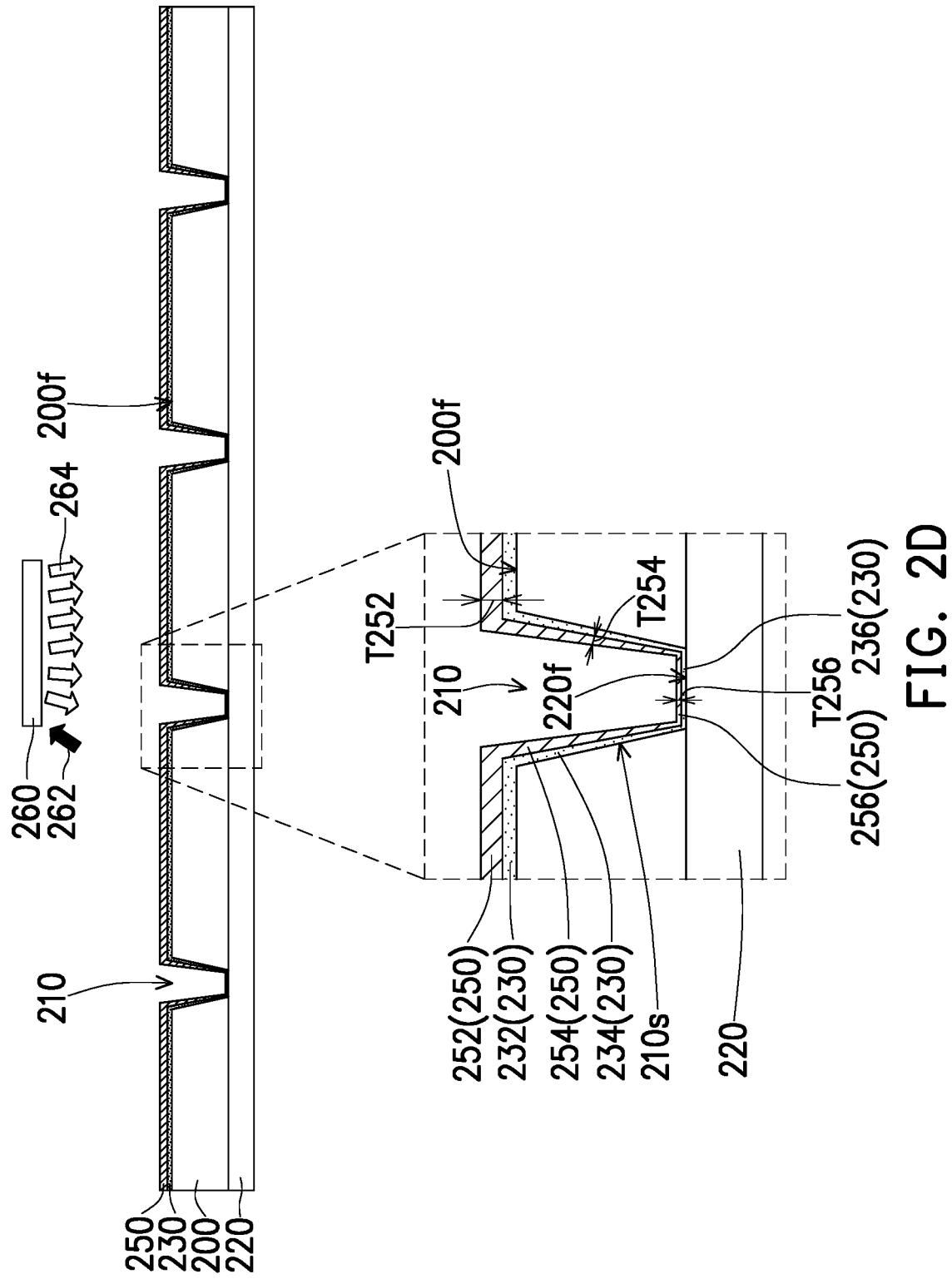

In FIG. 2D, the material of a frontside seed layer 250 is sputtered on the frontside barrier layer 230 (step S126 in FIG. 1). For example, one or more sputtering targets 260 are hit with high energy incident atoms or ions 262 to eject sputtered material 264 which is then deposited on the frontside barrier layer 230. In some embodiments, the pressure of the sputtering chamber and the energy of the incident atoms or ions 262 are selected so that the mean free path of the sputtered material 264 is sufficiently long to form the frontside seed layer 250 also on the section 236 of the frontside barrier layer 230 at the bottom of the through holes 210. It should be noted that while a single target 260 is illustrated in FIG. 2D, the disclosure is not limited thereto. For example, depending on the desired composition of the frontside seed layer 250, multiple sputtering targets 260 may be used. In some embodiments, the frontside seed layer 250 includes a metallic material, such as copper, silver, gold, nickel, titanium, alloys thereof, a combination thereof, or the like. In some embodiments, the frontside seed layer 250 is a copper-containing layer, including copper-based materials such as copper or copper alloys.

In some embodiments, the sputtered material 264 reaches the substrate 200 from the side of the frontside surface 200f. The resulting frontside seed layer 250 may thus have a shape similar to the one described before for the frontside barrier layer 230, including sections 252 extending on the sections 232 over the frontside surface 200f of the substrate 200, sections 254 extending on the sections 234 over the sidewalls 210s of the through holes 210, and sections 256 extending on the sections 236 at the bottom of the through holes 210 over the frontside surface 220f of the backside film 220. In some embodiments, the thicknesses T252, T254, T256 of the individual sections 252, 254, 256 of the frontside seed layer 250 may become increasingly smaller proceeding from the frontside surface 200f to the backside surface 200b, similar to what was previously described with respect to the frontside barrier layer 230. The thicknesses T252, T254, T256 are measured along directions normal to the surfaces 200f, 210s, 220f on which the corresponding sections 252, 254, 256 of the frontside seed layer 250 extend. So, for example, the sections 252 located over the frontside surface 200f may have a substantially constant thickness T252 and the sections 234 located over the sidewalls 210s of the through holes 210 have a decreasing thickness T254 proceeding towards the backside surface 200b. The sections 256 at the bottom of the through holes 210 may have a thickness T256 comparable to the thickness T254 of the sections 254 in proximity of the bottom surface 200b. In some embodiments, the thickness T256 of the sections 256 may be slightly larger towards the center of the through holes 210 than closer to the sidewalls 210s. In some embodiments, the frontside seed layer 250 is formed to have a thickness T236 in the range from 1 micrometer to 10 micrometers, such as of about 5 micrometers. In some embodiments, the frontside barrier layer 230 may decrease or even prevent diffusion of the material of the frontside seed layer 250 into the substrate 200.

Figure 2E:
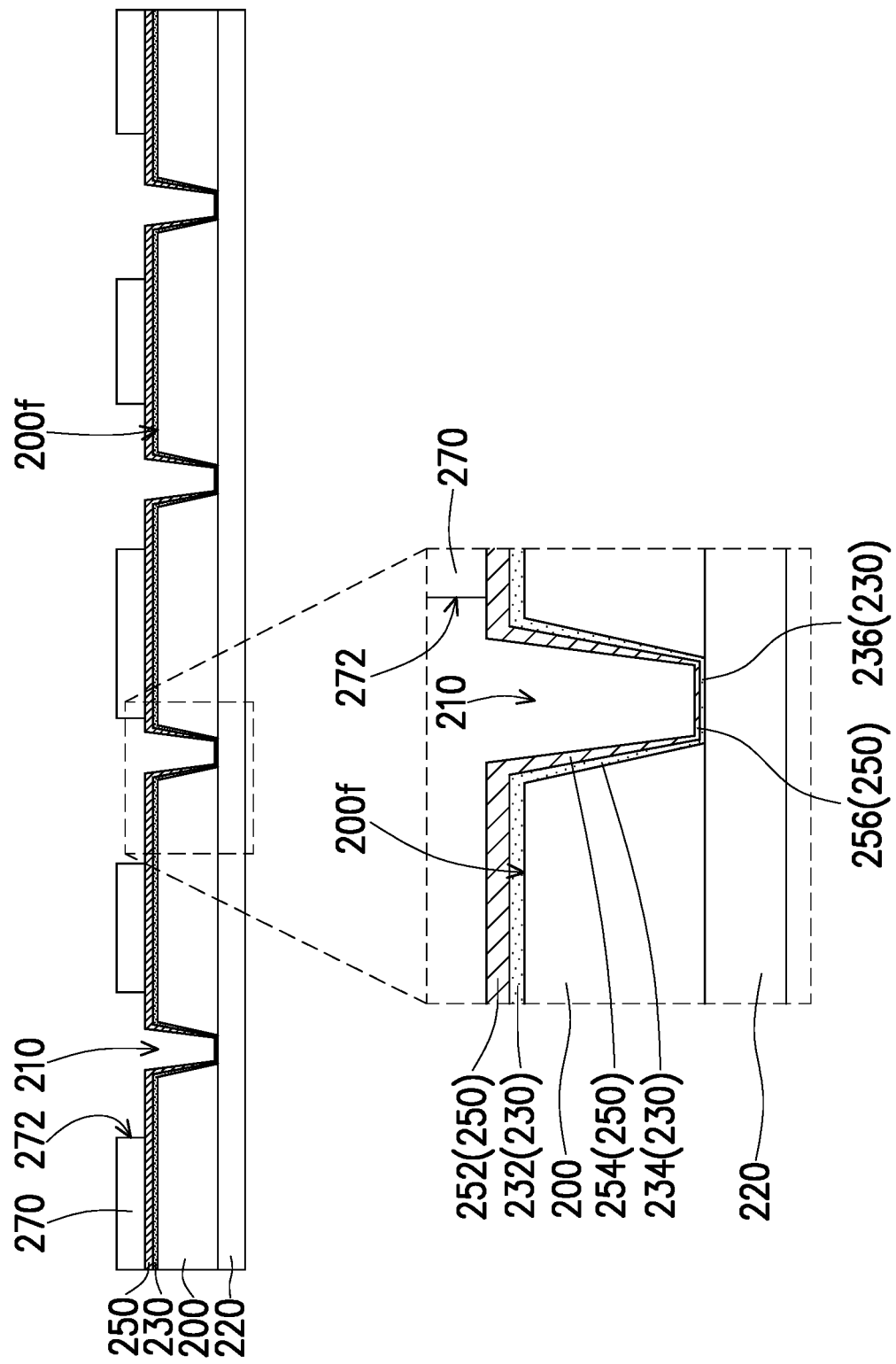

In some embodiments, once the frontside barrier layer 230 and the frontside seed layer 250 are formed, the substrate 200 may be taken out of the sputtering chamber for further processing. For example, as illustrated in FIG. 2E to FIG. 2I, a frontside redistribution layer (RDL) 340 may be formed on the frontside surface 200f (step S130 in FIG. 1). In FIG. 2E, a patterned mask 270 is formed on the frontside seed layer 250, over the frontside surface 200f of the substrate 200. In some embodiments, the patterned mask 270 includes a positive or a negative photoresist, and is formed, for example, through a sequence of deposition (e.g., spin on), exposure, and development steps. In some embodiments, the patterned mask 270 is patterned to include a plurality of openings 272 extending in regions where the through holes 210 are located. That is, the through holes 210 are exposed at the bottom of the openings 272.

Figure 2F:
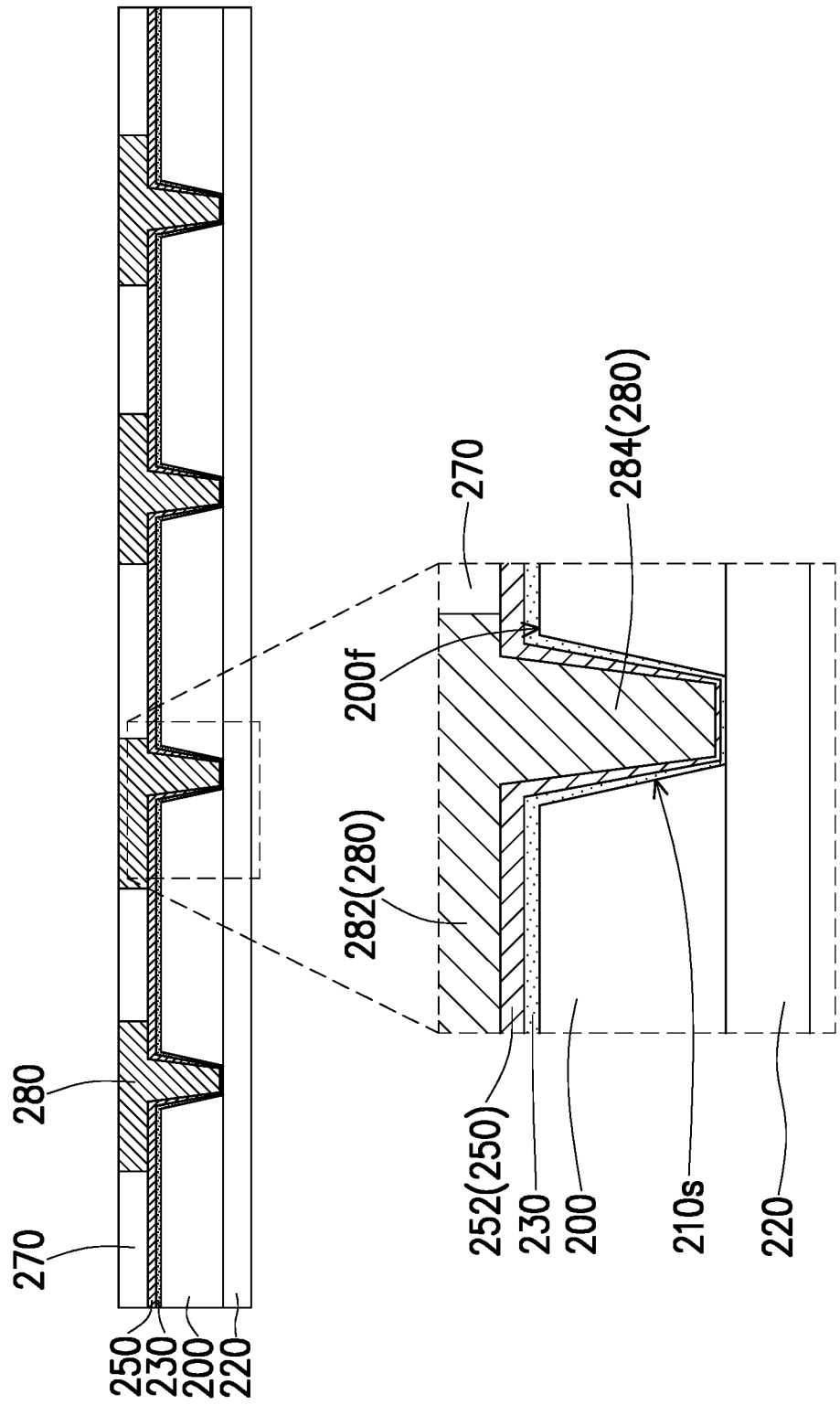
Figure 2G:
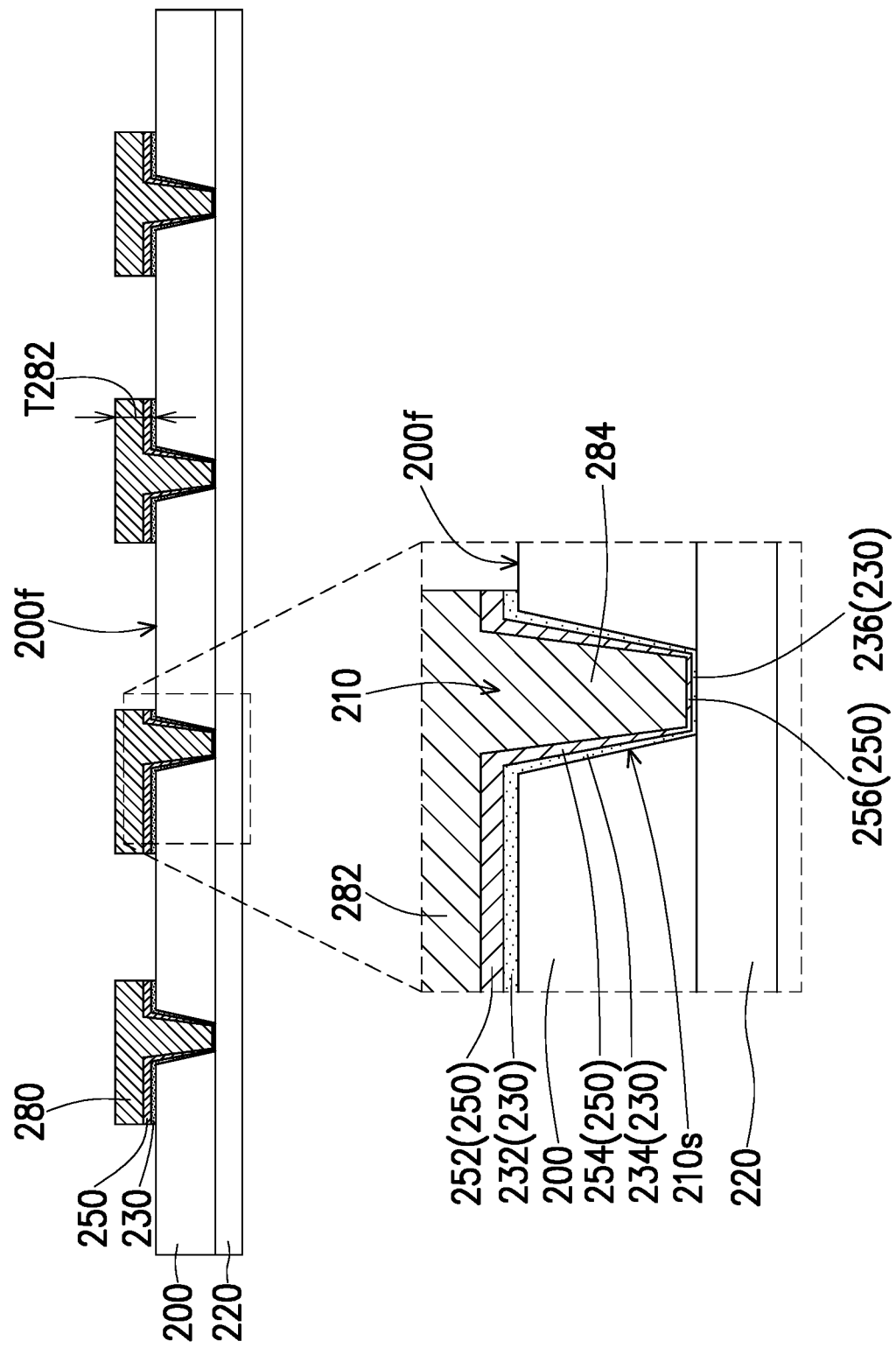

Referring to FIG. 2E and FIG. 2F, a conductive material is disposed in the openings 272 of the patterned mask 270 to form the patterned conductive traces 280. In some embodiments, the patterned conductive traces 280 includes routing patterns 282 extending on the horizontal sections 252 of the frontside seed layer 250, and routing vias 284 filling the through holes 210 in between the sidewalls 210s. The routing vias 284 may extend from the level height of the sections 252 (at the bottom of the routing patterns 282) to the sections 256 of the frontside seed layer 250 extending on the backside film 220. In some embodiments, the conductive material includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be deposited via one or more plating steps. In some embodiments, the routing vias 284 and the routing patterns 282 are integrally formed (e.g., formed as a single piece during a same plating step), so that electrical connection with low resistance is established between the routing vias 284 and the routing patterns 282. Referring to FIG. 2F and FIG. 2G, the patterned mask 270 is removed, for example via ashing or stripping. The portions of the frontside seed layer 250 and the frontside barrier layer 230 originally covered by the patterned mask 270 are also removed, for example via one or more etching steps. Difference in etching rates between the materials of the frontside barrier layer 230 and the frontside seed layer 250 with respect to the conductive material of the patterned conductive traces 280 may be exploited to selectively remove the exposed portions of the frontside seed layer 250 and the frontside barrier layer 230, thus revealing again the frontside surface 200f of the substrate 200. Sections 252 of the frontside seed layer 250 and sections 232 of the frontside barrier layer 230 remain underneath the regions of the routing patterns 282 extending on the frontside surface 200f of the substrate; sections 254 of the frontside seed layer 250 and sections 234 of the frontside barrier layer 230 remain between the routing vias 284 and the sidewalls 210s of the through holes 210; and sections 256 of the frontside seed layer 250 and sections 236 of the frontside barrier layer 230 remains at the bottom of the routing vias 280, separating the routing vias 284 from the backside film 220. In some embodiments, the routing patterns 282 may be formed rather thick, for example with a thickness T282 in the range from 20 micrometers to 60 micrometers.

Figure 2H:
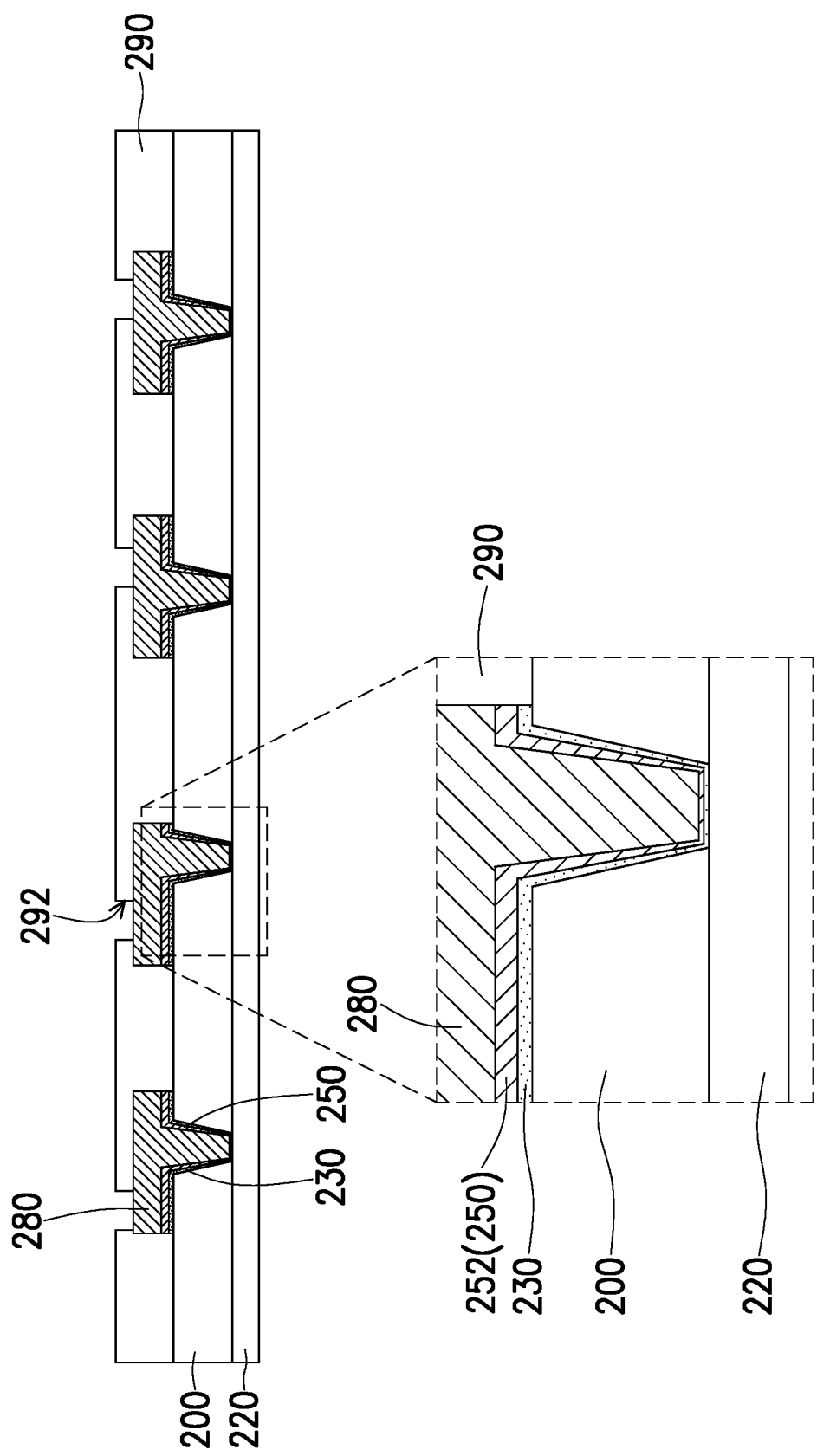
Figure 21:
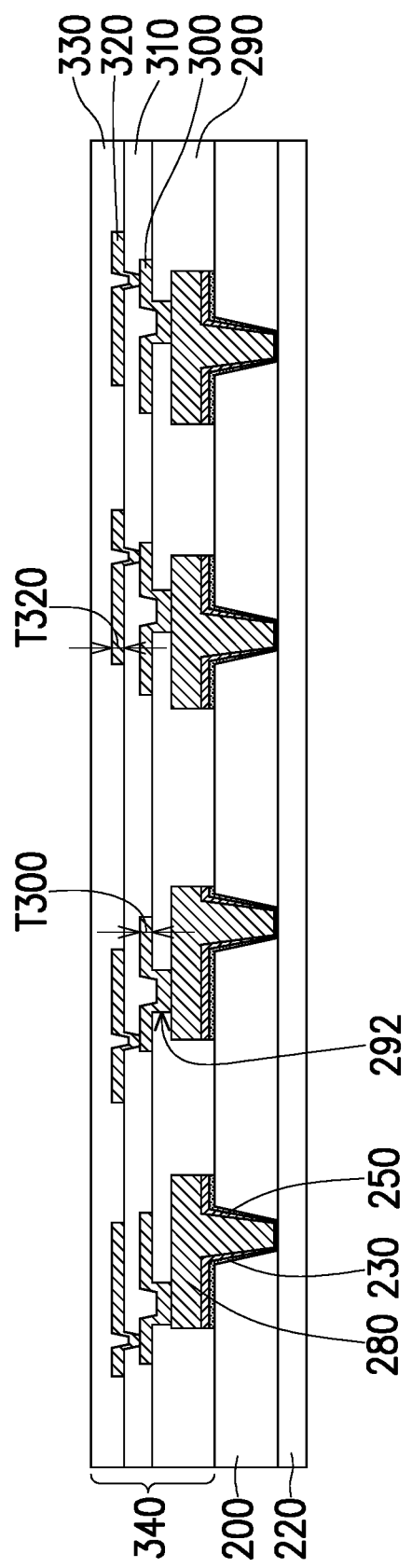

In FIG. 2H, a dielectric layer 290 is formed on the frontside surface 200f of the substrate 200, embedding the conductive traces 280. The dielectric layer 290 may be formed to be thicker than the conductive traces 280, and may be patterned to include openings 292 exposing at their bottom portions of the conducive traces 280. In some embodiments, the dielectric layer 290 includes an organic dielectric, for example a polymer such as polyimide, epoxy resin, acrylic resin, phenol resin, benzocyclobutene (BCB), polybenzoxazole (PBO), a combination thereof, or the like. In some embodiments, the dielectric layer 290 may be formed by spin-on coating, and patterned to include the openings 292. Auxiliary mask (not shown) may be employed to define the positions and shapes of the openings 292.

In FIG. 2I, the upper conductive layers 300, 320 and dielectric layers 310, 330 of the frontside RDL 340 are formed, following similar processes as previously described. For example, the conductive material of the conductive layer 300 is deposited on the dielectric layer 290 to form routing patterns extending on the dielectric layer 290 and routing vias extending in the openings 292 of the dielectric layer 290 to contact the conductive traces 280. The dielectric layer 310 may then be formed to embed the conductive layer 300, and the process may be repeated to form the conductive layer 320 and the dielectric layer 330. In some embodiments, the upper conductive layers 300, 320 are thinner than the conductive traces 280, for example with thicknesses T300, T320 (measured in correspondence of the routing patterns) in the range from 4 micrometers to 7 micrometers. At the manufacturing stage illustrated in FIG. 2I, the outermost dielectric layer 330 may completely cover the uppermost conductive layer 320.

Figure 2J:
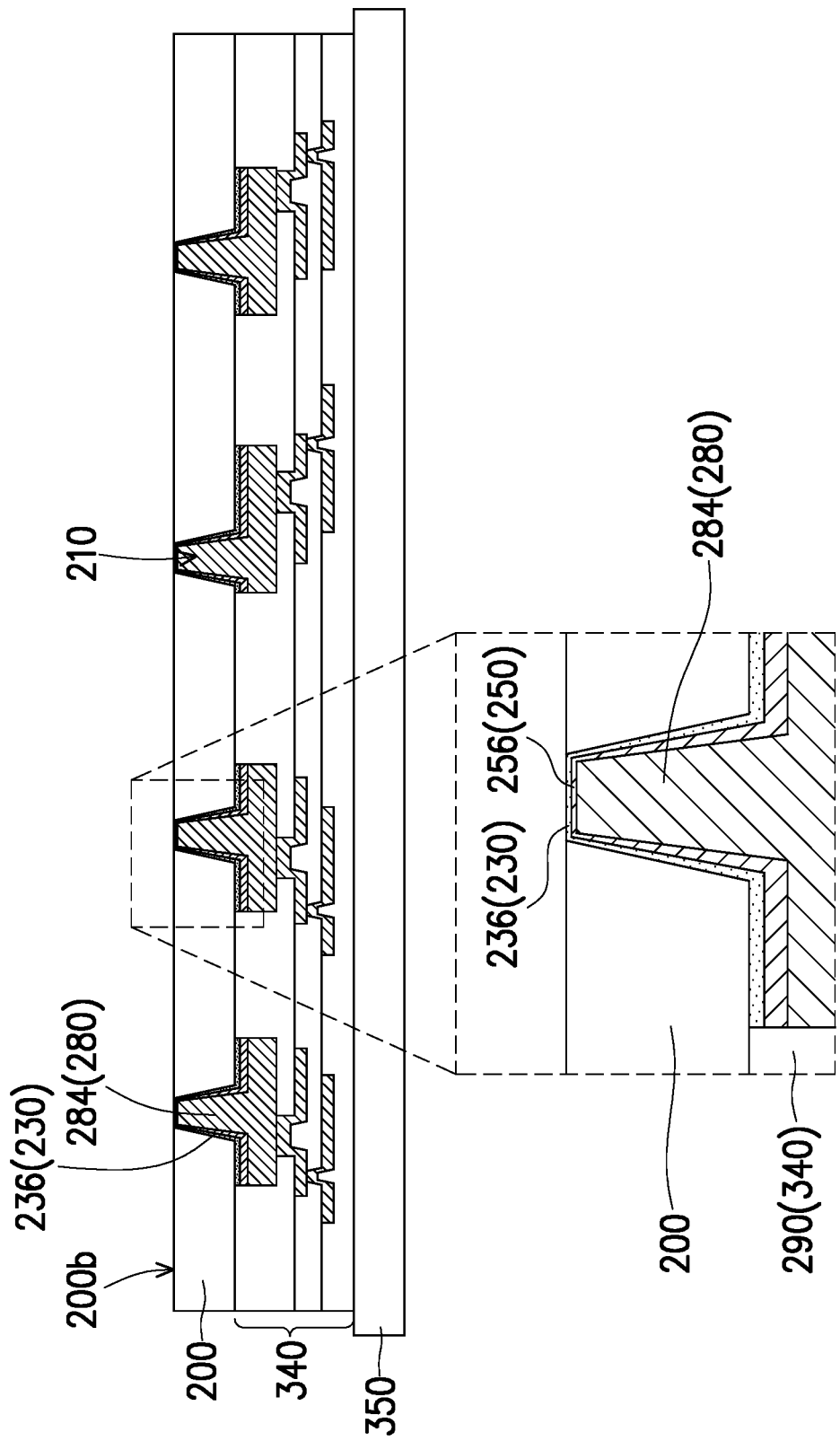

Referring to FIG. 2I and FIG. 2J, in some embodiments, a carrier 350 is detachably bonded to the outermost dielectric layer 330 of the frontside RDL 340. In some embodiments, the carrier 350 is a glass substrate, a metal plate, a plastic supporting board, or the like, but other suitable substrate materials may be used as long as the materials are able to withstand the subsequent steps of the process. In some embodiments, a de-bonding layer is provided on the carrier 350 to facilitate peeling the carrier 350 away from the structure when required by the manufacturing process. In some embodiments, the de-bonding layer includes a light-to-heat conversion (LTHC) release layer. The backside film 220 is removed (e.g., peeled) away from the backside surface 200b of the substrate 200, which backside surface 200b is thus exposed. In correspondence of the through holes 210, the sections 236 of the frontside barrier layer 230 are exposed, substantially coplanar with the backside surface 200b.

Figure 2K:
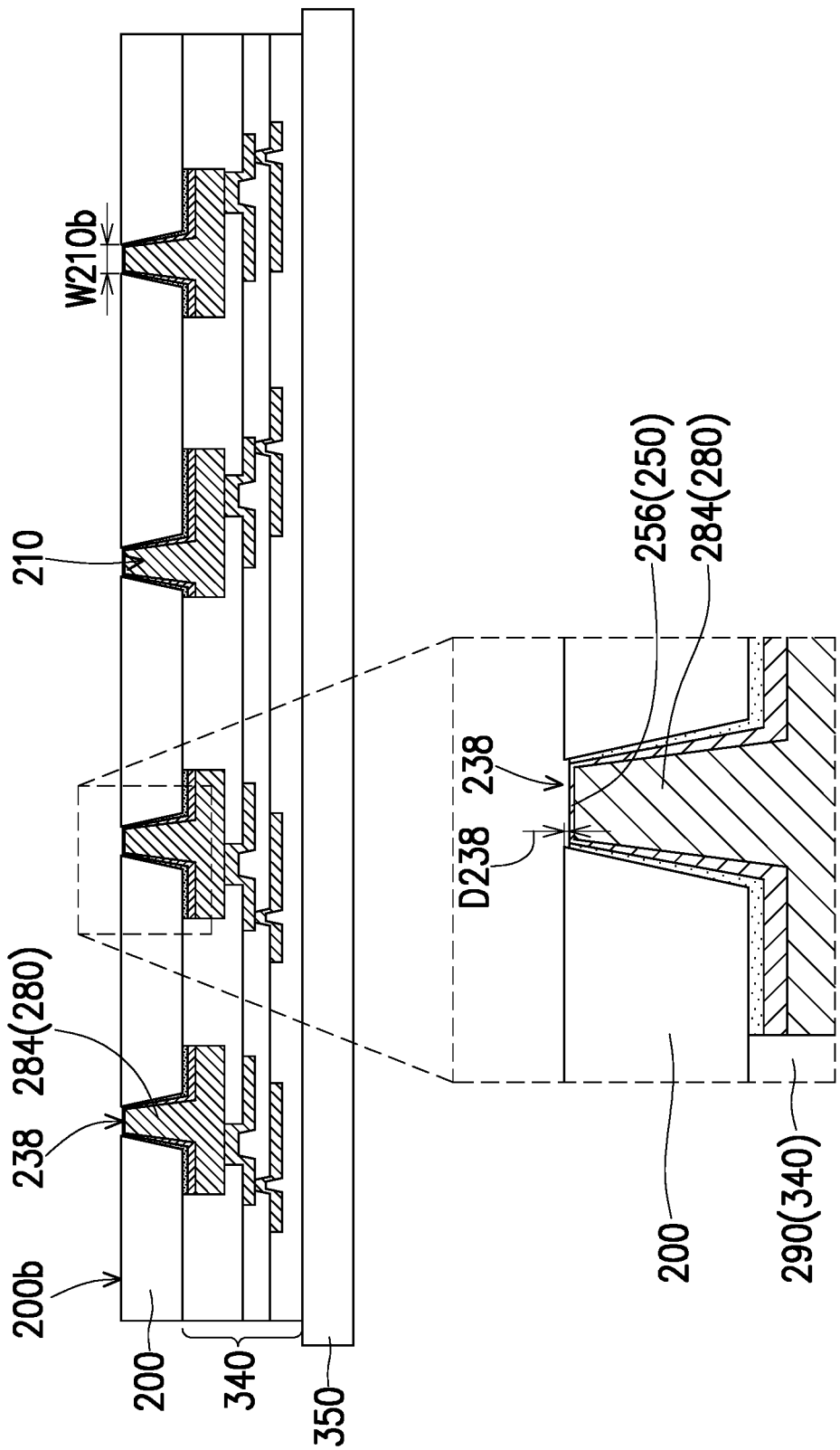

Referring to FIG. 2J and FIG. 2K, in some embodiments the sections 236 of the frontside barrier layer 230 are removed, for example via one or more etching steps (step S140 in FIG. 1). For example, difference in compositions between the frontside barrier layer 230 and the frontside seed layer 250 may be such that different etching rates are observed for the frontside barrier layer 230 and the frontside seed layer 250, thus allowing selective removal of the exposed portions of the frontside barrier layer 230. Upon removal of the section 236 of the frontside barrier layer 230, a recess 238 is formed at the level height of the backside surface 200b in correspondence of the through holes 210. In some embodiments, the sections 256 of the frontside seed layer 250 are exposed at the bottom of the recess 238. In some embodiments, a depth D238 of the recess 238 may be considered the distance between the level height of the backside surface 200b and the level height of the exposed section 256 of the frontside seed layer 250. In some embodiments, the depth D238 may be about in the range from 0.05 micrometers to 1 micrometer. In some embodiments, the span of the recess 238 substantially corresponds to the width W210b of the through holes 210 at the level of the backside surface 210b.

In some embodiments, the substrate 200 with the carrier 350 bonded thereto is introduced in a sputtering chamber to perform a sputtering process from the side of the backside surface 200b (step S150 in FIG. 1). In some embodiments, the sputtering process S150 includes a surface preparation step S152, a barrier layer sputtering step S154, and a seed layer sputtering step S156. In the preparation step S152, the backside surface 200b is pre-treated for subsequent material deposition. In some embodiments, a cleaning step, for example via plasma treatment, is performed to remove impurities which may have deposited or otherwise formed on the backside surface 200b, including possible oxidation products of the exposed sections 256 of the frontside seed layer 250. After cleaning, the sputtering chamber may be brought to the target temperature and pressure for the subsequent sputtering operations, as previously described.

Figure 2L:
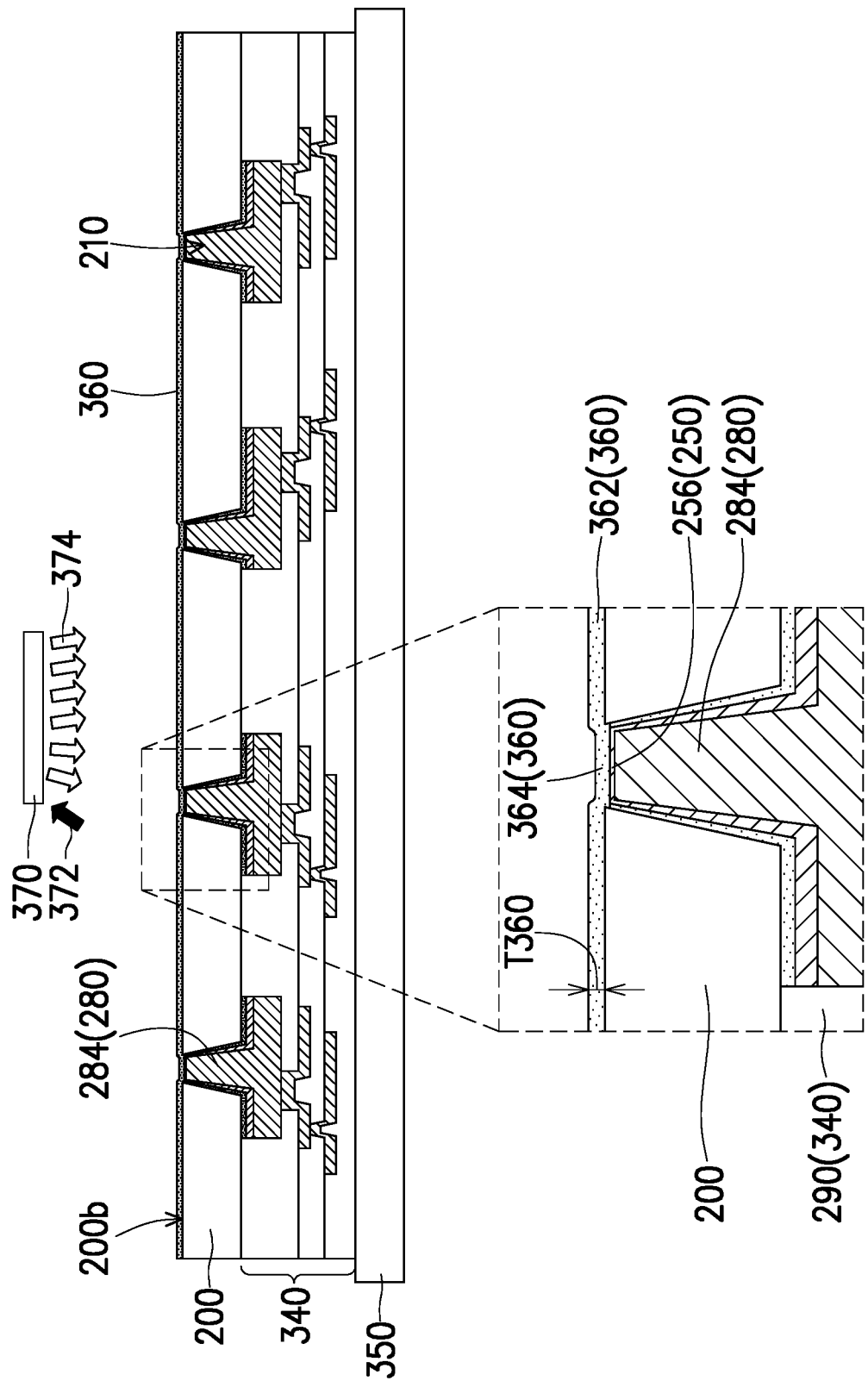

Referring to FIG. 2K and FIG. 2L, the material of a backside barrier layer 360 is sputtered on the backside surface 200b of the substrate 200 (step S154 of FIG. 1), including on the exposed sections 256 of the frontside seed layer 250 at the bottom of the recesses 238. For example, one or more sputtering targets 370 are hit with high energy incident atoms or ions 372 to eject sputtered material 374 which is then deposited on the substrate 200. It should be noted that while a single target 370 is illustrated in FIG. 2L, the disclosure is not limited thereto. For example, depending on the desired composition of the backside barrier layer 360, multiple sputtering targets 370 may be used. In some embodiments, the backside barrier layer 360 includes a metallic material, such as titanium, tantalum, a nitride thereof, or a combination thereof. In some embodiments, the backside barrier layer 360 is a titanium-containing layer, including a titanium-based material such as titanium, titanium nitride, or a combination thereof. In some embodiments, the backside barrier layer 360 is a tantalum-containing layer, including a tantalum-based material such as tantalum, tantalum nitride, or a combination thereof. In some embodiments, the backside barrier layer 360 and the frontside barrier layer 230 have substantially the same composition. In some embodiments, the sputtered material 374 reaches the substrate 200 from the side of the backside surface 200b. The resulting backside barrier layer 360 is blankety deposited over the backside surface 200b with a substantially homogeneous thickness T360. In some embodiments, the target thickness T360 may be in the range from 0.02 micrometers to 2 micrometers. In some embodiments, the backside barrier layer 360 is formed conformally over the substrate 200. For example, the backside barrier layer 360 includes sections 362 extending on the backside surface 200b of the substrate 200, and sections 364 extending on the frontside seed layer 250 at the bottom of the recesses 238. The sections 364 extending in the recesses 238 may be sunken (e.g., extend at a different level height along a thickness direction of the substrate 200) with respect to the sections 362.

Figure 2M:
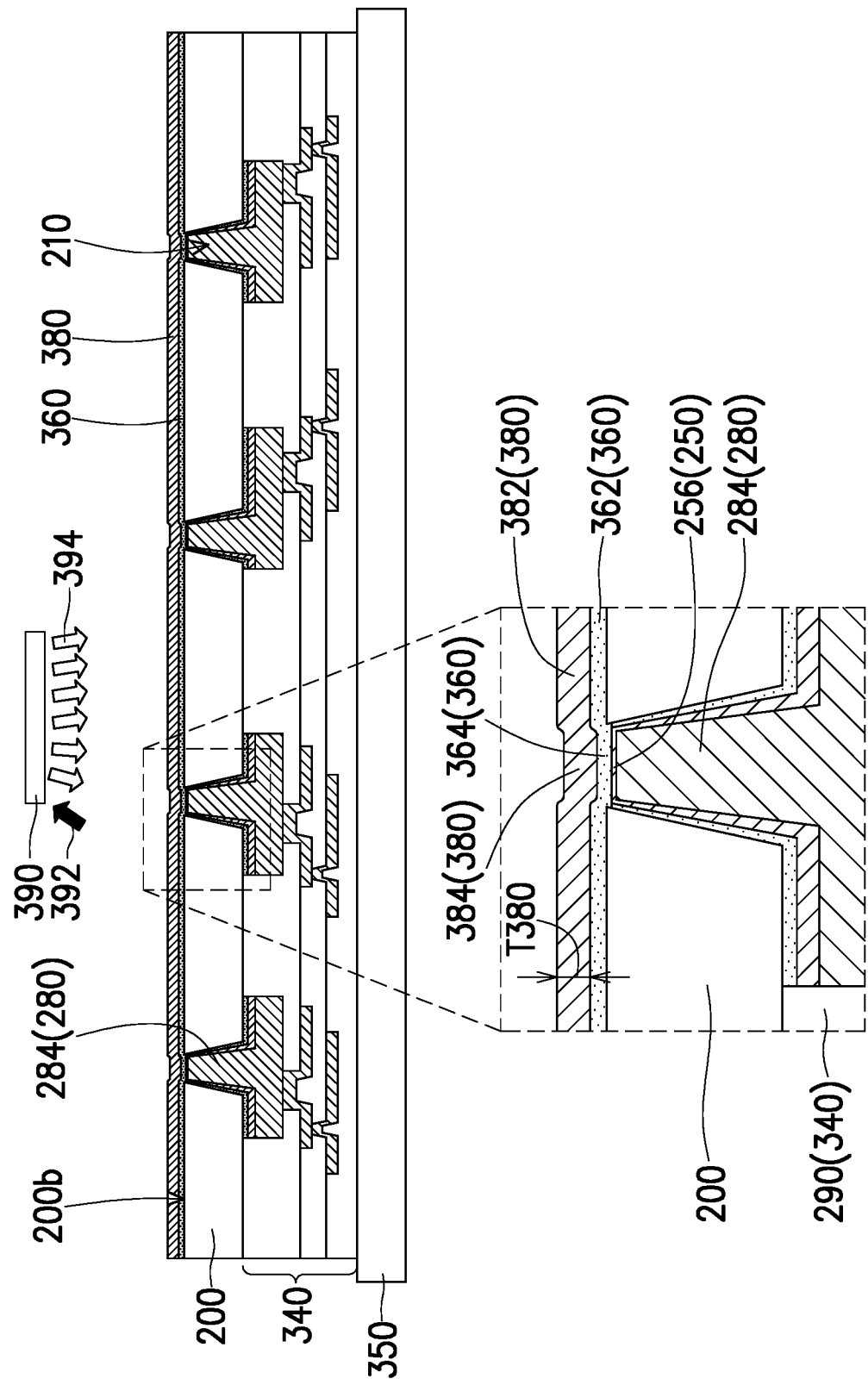

In FIG. 2M, the material of a backside seed layer 380 is sputtered on the backside barrier layer 360 (step S156 in FIG. 1). For example, one or more sputtering targets 390 are hit with high energy incident atoms or ions 392 to eject sputtered material 394 which is then deposited on the backside barrier layer 360. It should be noted that while a single target 390 is illustrated in FIG. 2L, the disclosure is not limited thereto. For example, depending on the desired composition of the backside seed layer 380, multiple sputtering targets 390 may be used. In some embodiments, the backside seed layer 380 includes a metallic material, such as copper, silver, gold, nickel, titanium, alloys thereof, a combination thereof, or the like. In some embodiments, the backside seed layer 380 is a copper-containing layer, including copper-based materials such as copper or copper alloys. In some embodiments, the composition of the backside seed layer 380 may be substantially the same as the composition of the frontside seed layer 250. In some embodiments, the sputtered material 394 reaches the substrate 200 from the side of the backside surface 200b. The resulting backside seed layer 380 is blankety deposited on the backside barrier layer 360 with a substantially homogeneous thickness T380. In some embodiments, the target thickness T380 may be in the range from 0.05 micrometers to 5 micrometers. In some embodiments, the backside seed layer 380 is conformally deposited on the backside barrier layer 360. For example, the backside seed layer 380 includes sections 382 extending on the sections 362 of the backside barrier layer 360, and sections 384 extending on the sections 364 of the backside barrier layer 360 in correspondence of the recesses 238. The sections 384 may be sunken (e.g., extend at a different level height along a thickness direction of the substrate 200) with respect to the sections 382.

Figure 2N:
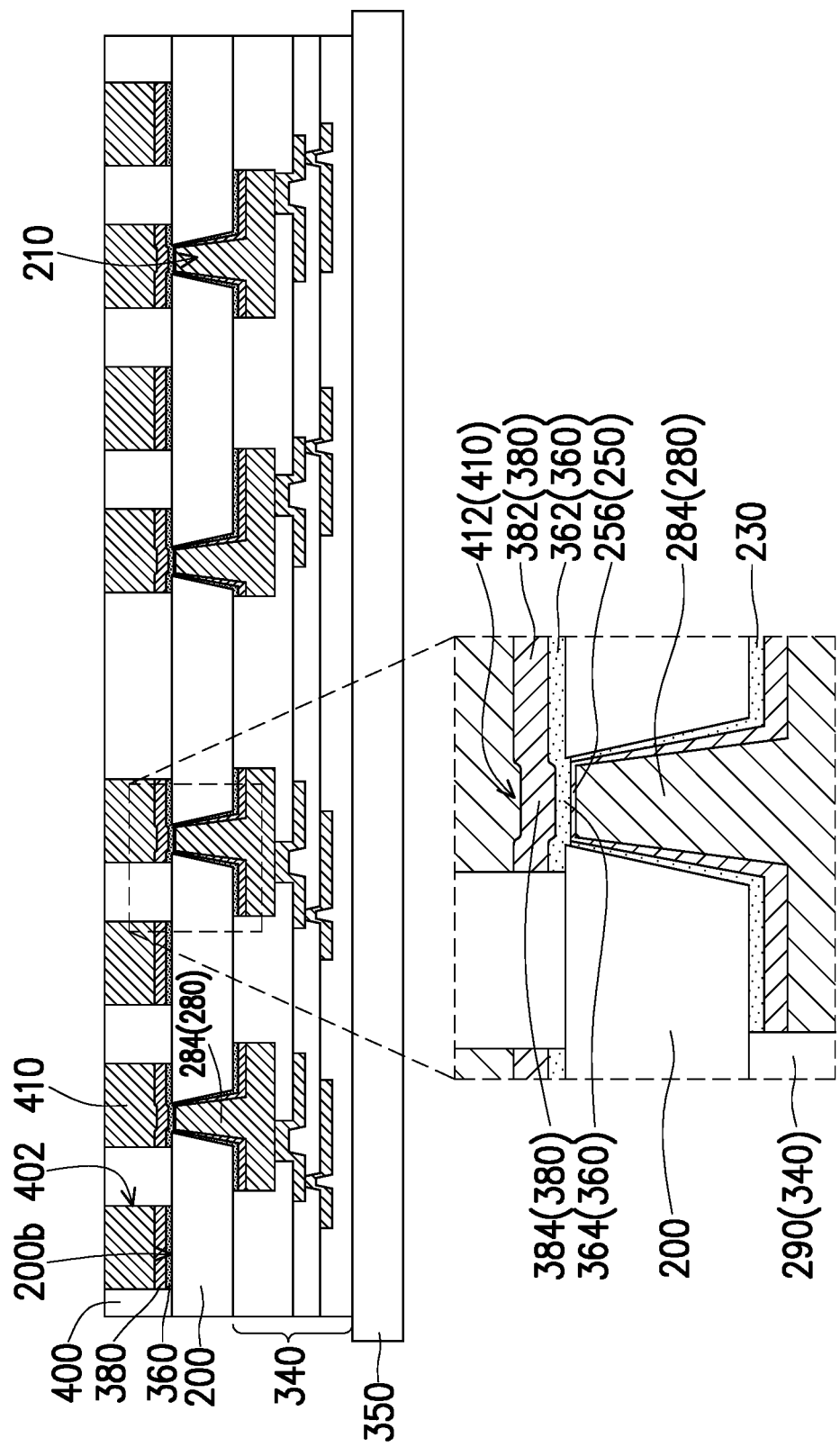
Figure 20:
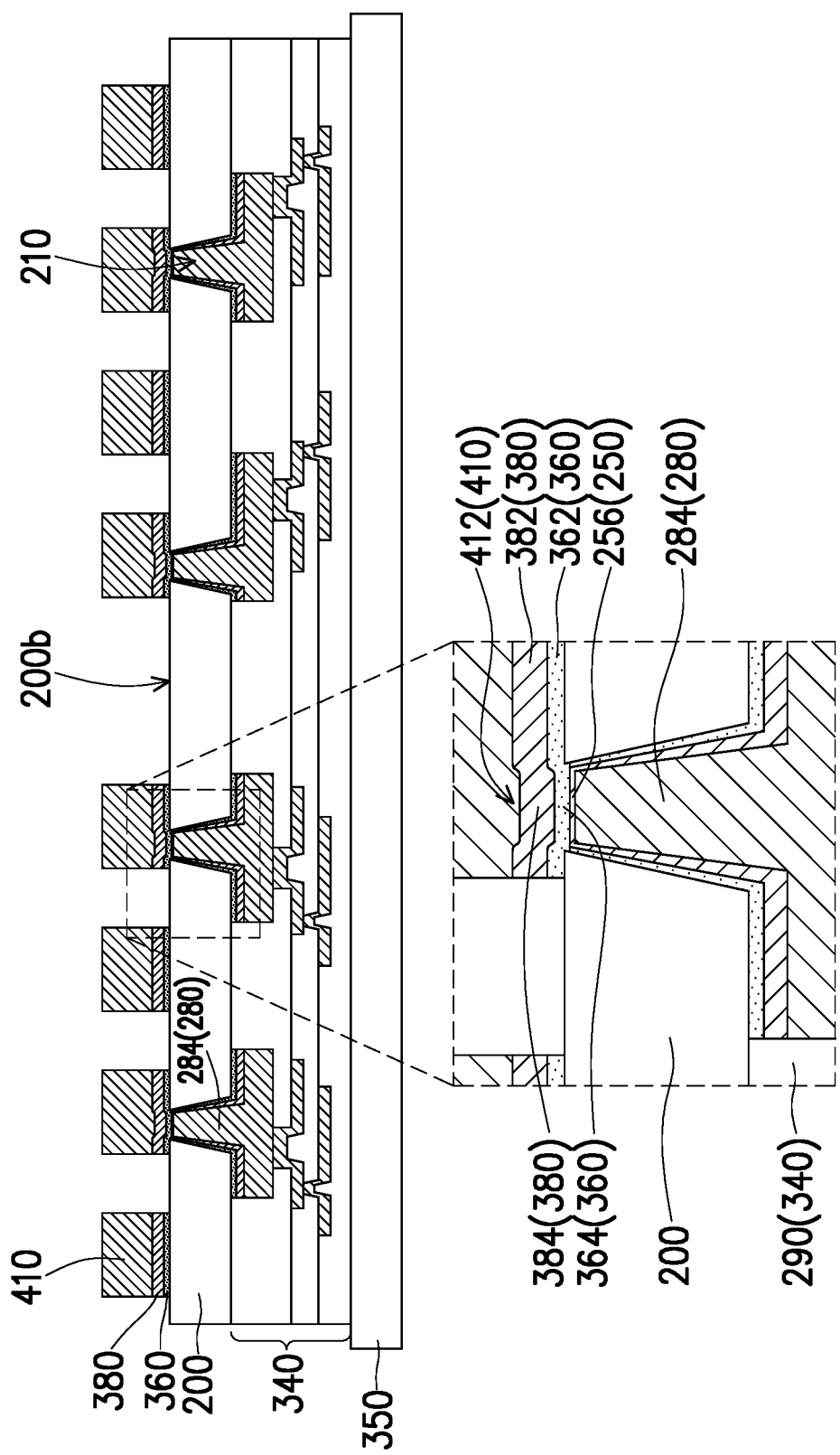

In some embodiments, once the backside barrier layer 360 and the backside seed layer 380 are formed, the substrate 200 may be taken out of the sputtering chamber for further processing. For example, as illustrated in FIG. 2N to FIG. 2Q, a backside RDL 440 may be formed on the backside surface 200b (step S160 in FIG. 1). In FIG. 2N, a patterned mask 400 is formed on the backside seed layer 380, with similar materials and process steps as previously described for the patterned mask 270 of FIG. 2E. The patterned mask 400 includes openings 402 exposing at their bottom at least the sections 384 of the backside seed layer 380 extending in correspondence of the through holes 210. A conductive material is disposed within the openings 402 to form the conductive blocks 410. The conductive blocks 410 may be routing patterns extending on the backside seed layer 380, electrically connected (via the respective seed layers 250, 380 and the barrier layer 360) to the conductive traces 280 filling the through holes 210. In some embodiments, the conductive blocks 410 include protrusions 412 in correspondence of the sunken sections 364, 284 of the backside barrier layer 360 and the backside seed layer 380. Materials and processes to form the conductive blocks 410 may be similar to the ones previously described for the conductive traces 280, with the additional conductive material being formed on the backside seed layer 380 (e.g., without being deposited in the through holes 210, which through holes 210 are already filled by the routing vias 284). In some embodiments, the material of the seed layers 380, 250 may have higher electrical conductivity than the material of the backside barrier layer 360 and the frontside barrier layer 230. In some embodiments, because the frontside barrier layer 230 has been removed from the side of the backside surface 200b, only the backside barrier layer 360 is interposed between the frontside seed layer 250 and the backside seed layer 380. Referring to FIG. 2N and FIG. 2O, the patterned mask 400 and the underlying portions of backside seed layer 380 and backside barrier layer 360 are removed to expose the backside surface 200b of the substrate, similar to what was previously described with reference to FIG. 2G. Portions of the backside seed layer 380 and the backside barrier layer 360 remains at the bottom of the conductive blocks 410, between the conductive blocks 410 and the substrate 200, and between the conductive blocks 410 and the frontside seed layer 250 in correspondence of the through holes 210.

Figure 2P:
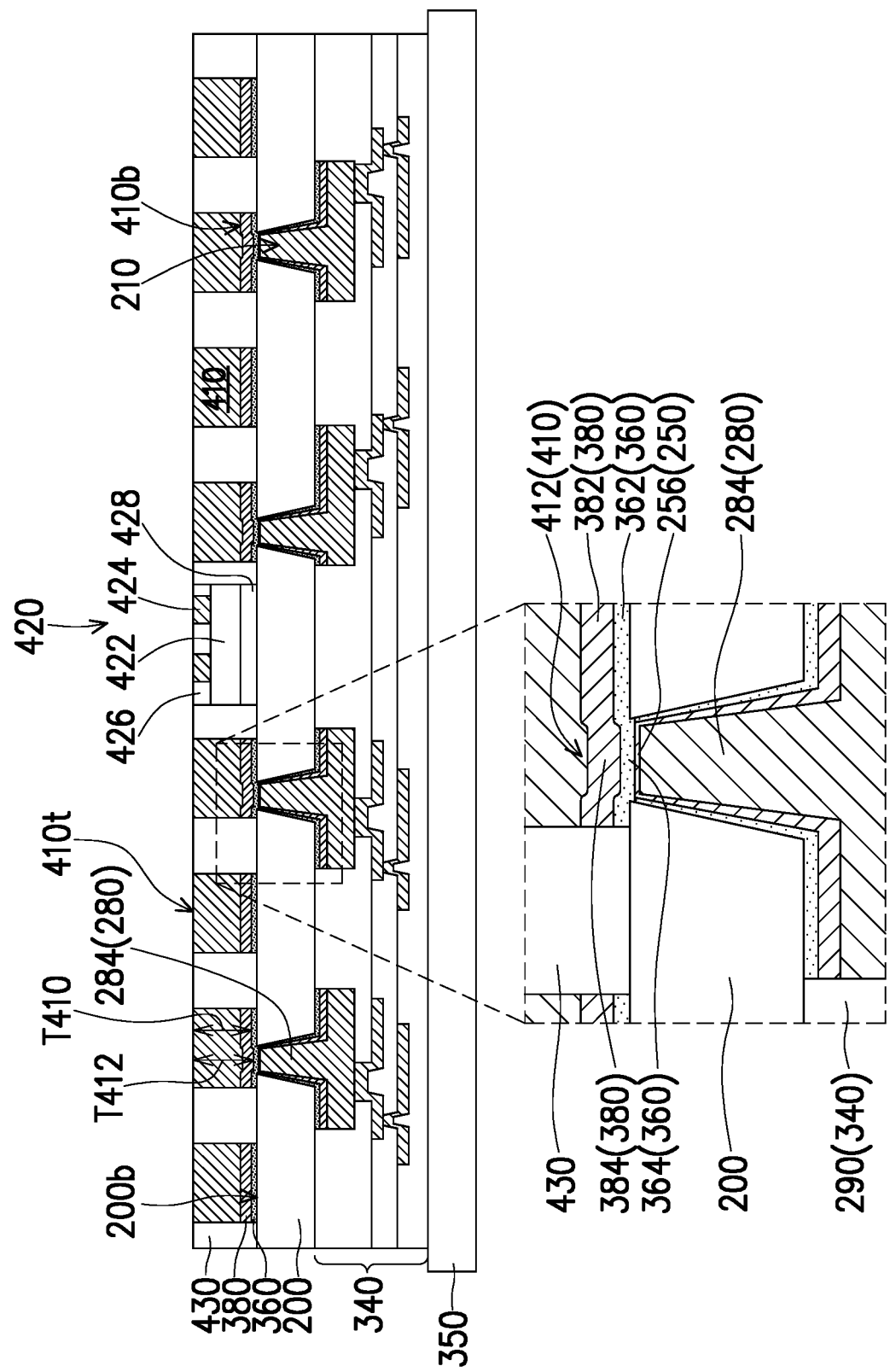

In FIG. 2P, one or more semiconductor dies 420 are disposed on the substrate 200, amongst the conductive blocks 410. Briefly, a semiconductor die 420 may include a semiconductor substrate 422 in which active and/or passive devices are formed, conductive pads 424 formed on a side of the semiconductor substrate 422 to establish electrical connection to the active and/or passive devices, a protection layer 426 in which the conductive pads 424 are embedded, and an adhesive layer 428 securing the semiconductor substrate 422 to the substrate 200. In some embodiments, the semiconductor die 420 may be a memory die, such as a high-bandwidth memory, a logic die, such as a central processing unit (CPU) die, a graphic processing unit (GPU) die, a micro control unit (MCU) die, an input-output (I/O) die, a baseband (BB) die, or an application processor (AP) die, and so on. In some embodiments, the semiconductor die 420 is a signal processing die.

In some embodiments, an encapsulant 430 is formed on the substrate 200 to laterally encapsulate the semiconductor die 420 and the conductive blocks 410. A material of the encapsulant 430 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant is formed by a sequence of over-molding and planarization steps, whereby the material of the encapsulant 430 is removed until the conductive pads 424 of the semiconductor die 420 and the top surfaces 410t of the conductive blocks 410 are exposed. In some embodiments, the top surface 410t of the conductive blocks 410 may be substantially flat following the planarization step, while the opposite bottom surfaces 410b may present unevenness in correspondence of the through holes 210. That is, the conductive blocks 410 may have thickness T410 when extending over the substrate 200 and a thickness T412 greater than the thickness T410 in correspondence of the through holes 210, where the protrusions 412 are formed. In some embodiments, the thicknesses T410 and 412 may be considered as the distance from the top surface 410t to the bottom surface 410b or to the backside barrier layer 360, if no clear interface is observable between the conductive blocks 410 and the frontside seed layer 380. In some embodiments, the conductive blocks 410 are formed of comparable thickness T410 to the semiconductor die 420, so that the conductive blocks 410 can provide vertical connection through the encapsulant 430. In some embodiments, the thickness T410 of the conductive blocks 410 may be greater than about 100 micrometers, for example in the range from 100 micrometers up to 250 micrometers.

Figure 2Q:
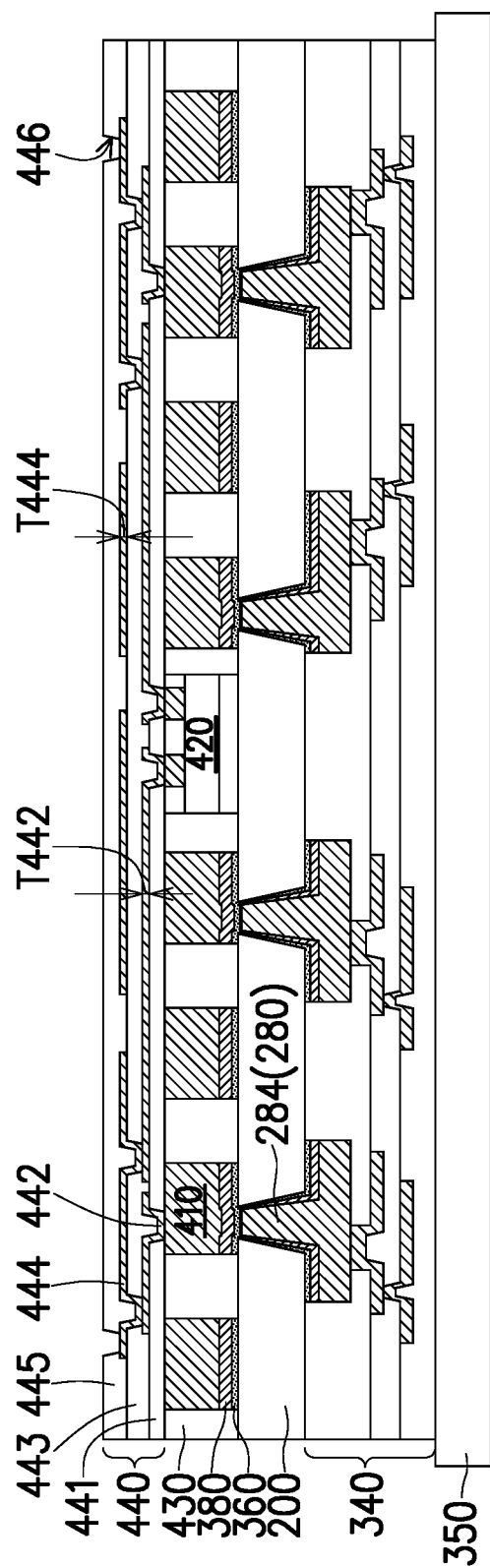

In FIG. 2Q, the backside RDL 440 is formed on the encapsulated semiconductor die 420 and the conductive blocks 410, by alternately forming the dielectric layers 441, 443, 445 and the conductive layers 442, 444, following similar processes as previously described for the frontside RDL 340. In some embodiments, the outermost dielectric layer 445 is patterned to include openings 446 exposing portions of the outermost conductive layer 444. In some embodiments, the conducive layers 442, 444 are formed to be thinner than the conductive blocks 410, for example with thicknesses T442, T444 independently in the range from 4 micrometers to 7 micrometers.

Figure 2R:
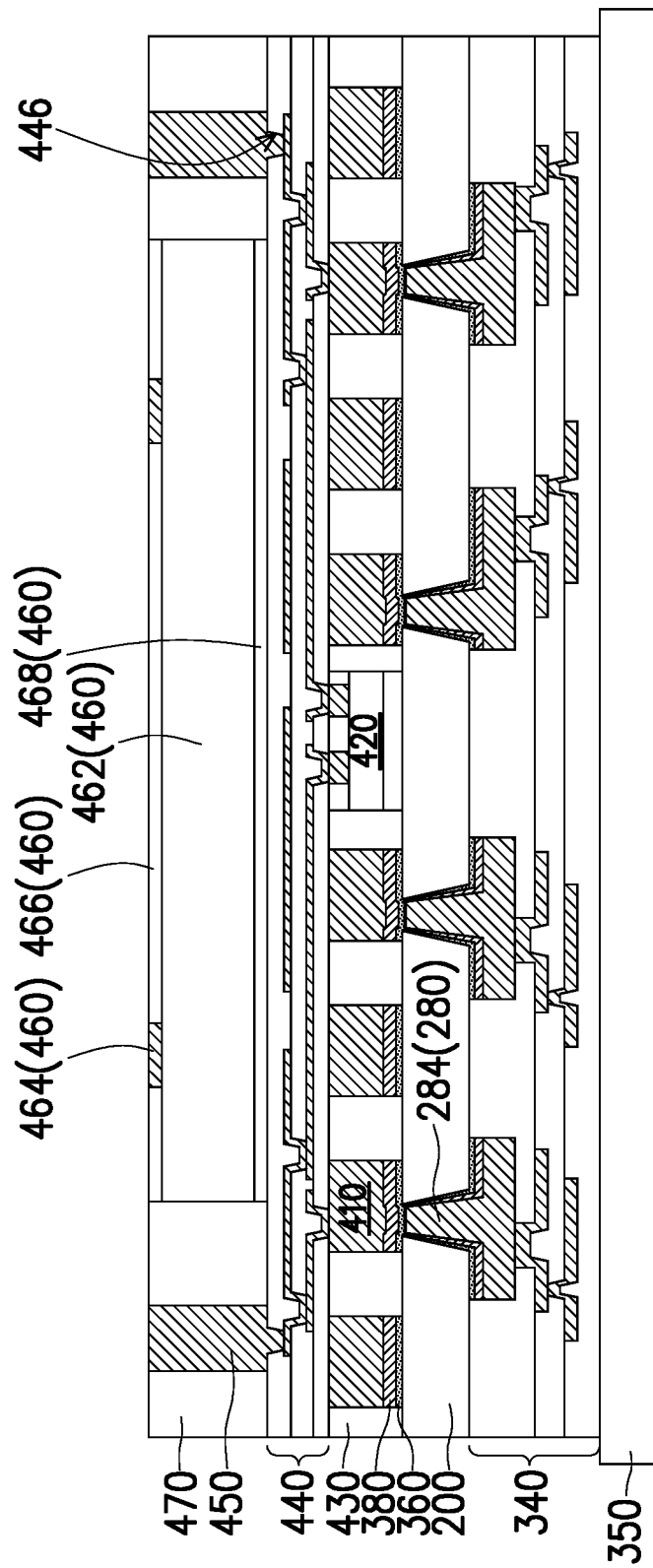

In FIG. 2R, through insulator vias (TIVs) 450 are formed in correspondence of the openings 446 of the backside RDL 440, to contact the uppermost conductive layer 444. In some embodiments, the TIVs 450 are formed by disposing a conductive material in the openings of a patterned mask (not shown). The conductive material may be disposed be any suitable process, such as a plating step or the like. In some embodiments, a semiconductor die 460 is placed on the backside RDL 440 amongst the TIVs 450. Briefly, the semiconductor die 460 may include a semiconductor substrate 462 in which active and/or passive devices are formed, conductive pads 464 formed on a side of the semiconductor substrate 462 to establish electrical connection to the active and/or passive devices, a protection layer 466 in which the conductive pads 464 are embedded, and an adhesive layer 468 securing the semiconductor substrate 462 to the backside RDL 440. In some embodiments the semiconductor die 460 is a micro-electromechanical system, and may be adapted to sense external stimuli such as radiation, sounds, pressure or the like. In some embodiments, the TIVs 450 and the semiconductor die 460 may be encapsulated in the encapsulant 470, which may be formed with similar materials and processes as previously described for the encapsulant 430.

Figure 2S:
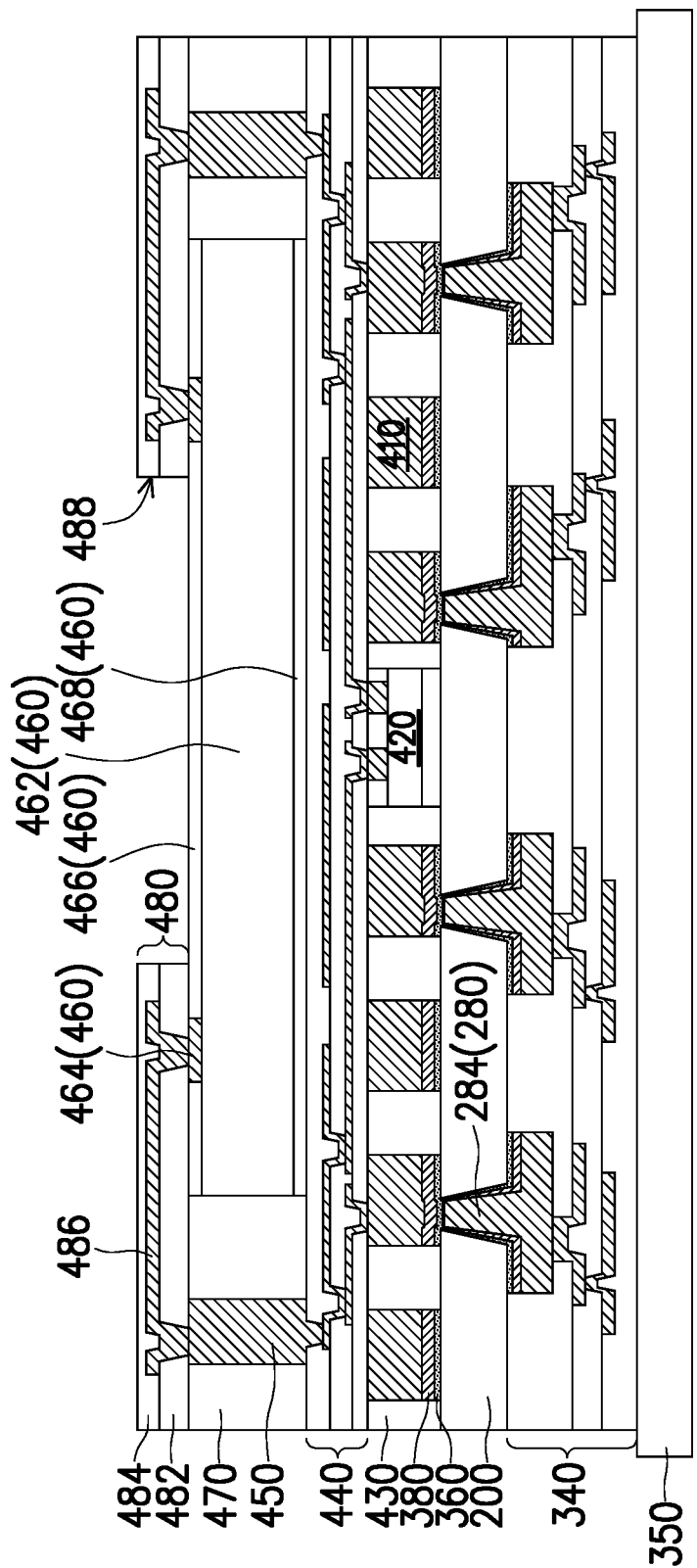

In FIG. 2S, an additional RDL 480 is formed on the encapsulated semiconductor die 460 and the TIVs 450, following similar processes as previously described for the backside RDL 440. In some embodiments, the RDL 480 includes dielectric layers 482, 484 and at least one conductive layer 486 alternately stacked, with the conductive layer 486 interconnecting the conductive pads 464 of the semiconductor die 460 to the TIVs 450. In some embodiments, the RDL 480 may be formed to include at least one opening 488 exposing a sensing area of the semiconductor die 460. For example, a mask (not shown) may be disposed on the sensing area of the semiconductor die 460 to prevent the materials of the RDL 480 being deposited on the sensing area. The mask may then be removed, resulting in the opening 488. In some embodiments, the die 460 may sense an incoming stimulus (e.g., radiation, sound wave, etc.) in correspondence of the opening 488 of the RDL 480, and may generate a signal in response which is then transmitted for further processing to the semiconductor die 420 through the RDLs 480, 440 and the TIVs 450. It will be apparent that, depending on the type of semiconductor die 460 and the type of stimulus to be sensed, the opening 488 (and, more in general, the structure of the RDL 480) may be adapted accordingly.

Figure 2T:
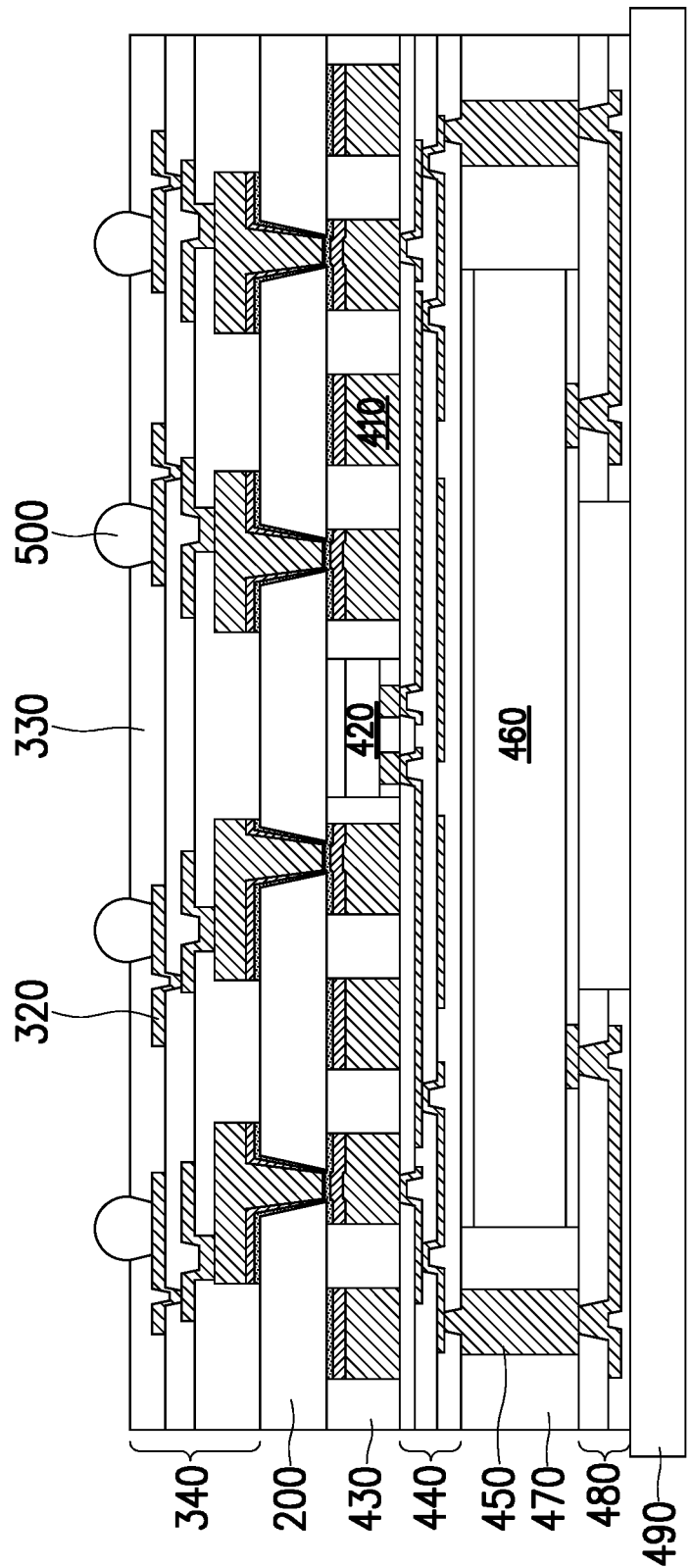
Figure 2U:
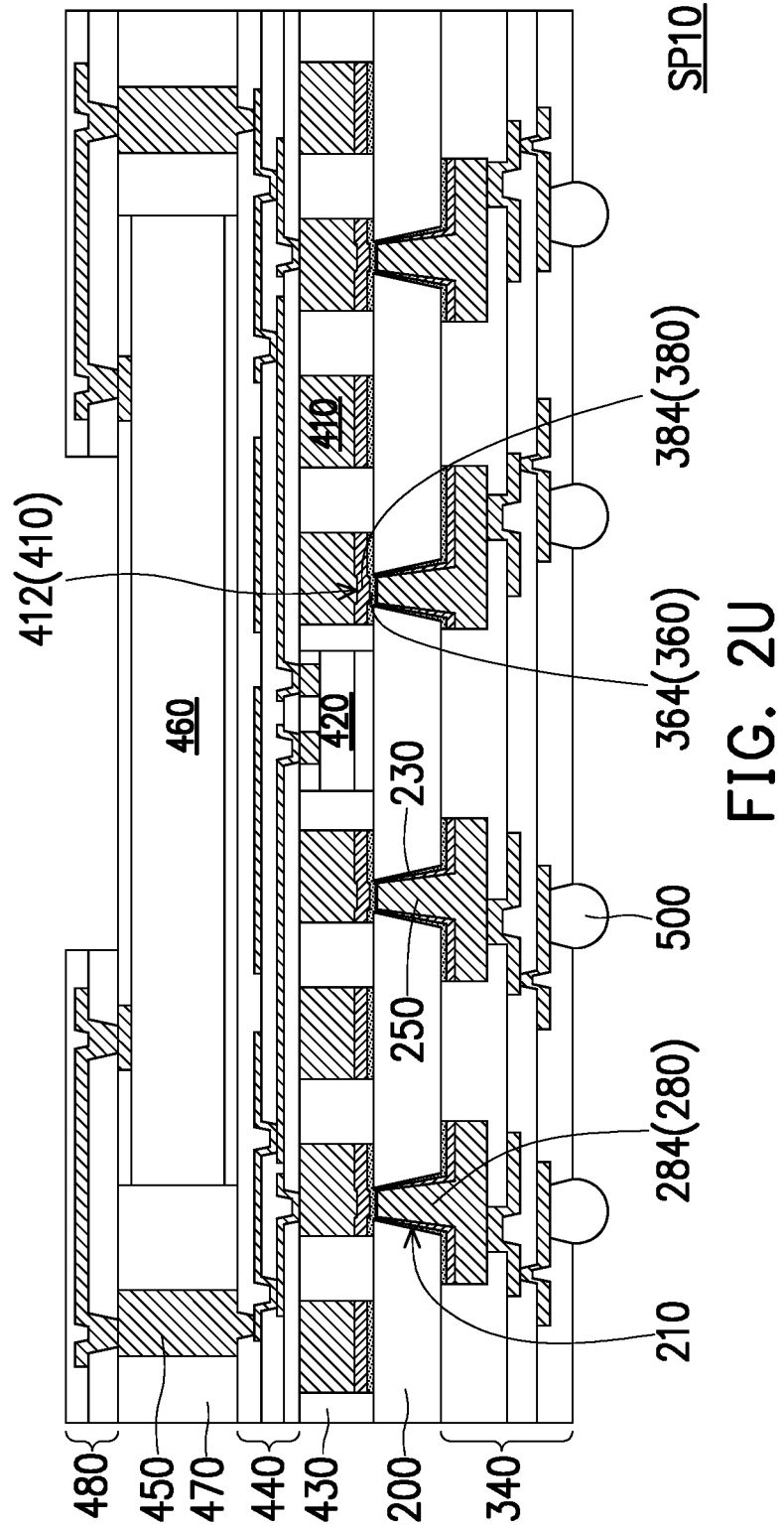

Referring to FIG. 2S and FIG. 2T, an auxiliary carrier 490 may be bonded to the RDL 480, and the carrier 350 may be removed. For example, if an LHTC layer is included in the debonding layer, the LHTC may be irradiated to release the carrier 350. The outermost dielectric layer 330 of the frontside RDL 340 may thus be available for further processing. In some embodiments, openings are formed in the dielectric layer 330, for example via laser drilling, to expose regions of the underlying conductive layer 320. Conductive terminals 500 (optionally with underlying metallurgies, not shown) are formed in the openings to contact the exposed regions of the conductive layer 320. In some embodiments, the conductive terminals 500 include solder balls, ball grid array (BGA) connectors, metal pillars, controlled collapse chip connection (C4) bumps, micro bumps, bumps formed via electroless nickel—electroless palladium—immersion gold technique (ENEPIG), a combination thereof (e.g., a metal pillar with a solder ball attached), or the like.

Referring to FIG. 2T and FIG. 2U, in some embodiments, if the process has been performed at wafer level, a singulation step may be included to separate individual semiconductor packages SP10, and the carrier 490 may then be removed. Based on the process just described, it is possible to form semiconductor packages SP10 in which the redistribution structures (e.g., the frontside RDL 340 and the backside RDL 440 with the conductive blocks 410) at opposite sides of the substrate 200 are interconnected by through substrate vias (e.g., the routing vias 284) formed in through holes 210 of the substrate 200. What is more, by temporarily masking the through holes 210 as blind holes by way of the backside film 220, the plating steps at opposite sides of the substrate 200 may be performed at different manufacturing stages. This allows not only to build asymmetrical redistribution structures at opposite sides of the substrate 200, but also to use, for example, single-side plating tools rather than double-side plating tools. What is more, at least the frontside RDL 340 is directly connected to the routing vias 284 without intervening barrier layers, thus lowering the resistance of the electrical connection. At the opposite side of the substrate, the material of the frontside barrier layer 230 may be removed before forming the backside barrier layer 360 and the backside seed layer 380, resulting in a bulging shape of the conductive blocks 410 in correspondence of the through holes 210 (e.g., including the protrusion 412). In some embodiments, the frontside barrier layer 230 is interposed between the conductive material of the routing vias 284 and the substrate 200, thus enhancing adhesion and preventing or reducing delamination failures. Furthermore, out-diffusion of the conductive material to the substrate 200 may also be prevented or reduced.

Figure 3:
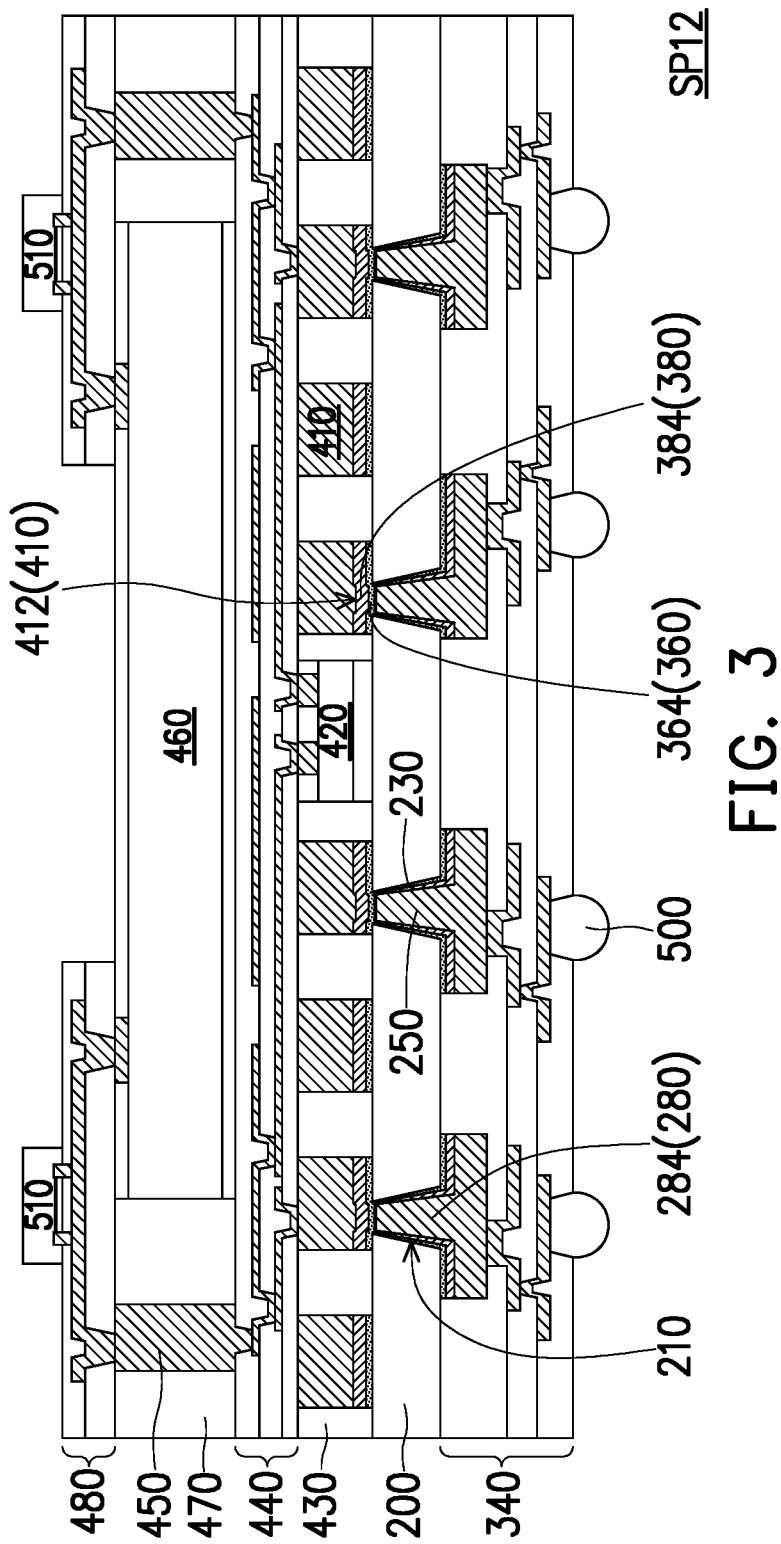
FIG. 3 is a schematic cross-sectional view of a semiconductor package according to some embodiments of the disclosure.

In some embodiments, the semiconductor package SP10 may be integrated with additional components. For example, in FIG. 3, the semiconductor package SP12 has substantially the same structure as the semiconductor package SP10 of FIG. 2U, with additional integrated passive devices 510 connected to the RDL 480, for example in between the semiconductor die 460 and the TIVs 450. In some embodiments, the integrated passive devices 510 may preliminary transform the signal transmitted by the semiconductor die 460 upon detection of an external stimulus. It will be apparent that the structures illustrated for the semiconductor packages SP10, SP12 are only exemplary, and that different components may be formed at the two sides of the substrate 200 (e.g., different types or number of semiconductor dies 420, 460, RDLs 440, 480, etc.). Furthermore, all semiconductor packages disclosed may include additional components (such as the integrated passive devices 510), or may be integrated in larger electronic devices (for example, by connecting to printed circuit boards or the like via the conductive terminals 500).

Figure 4:
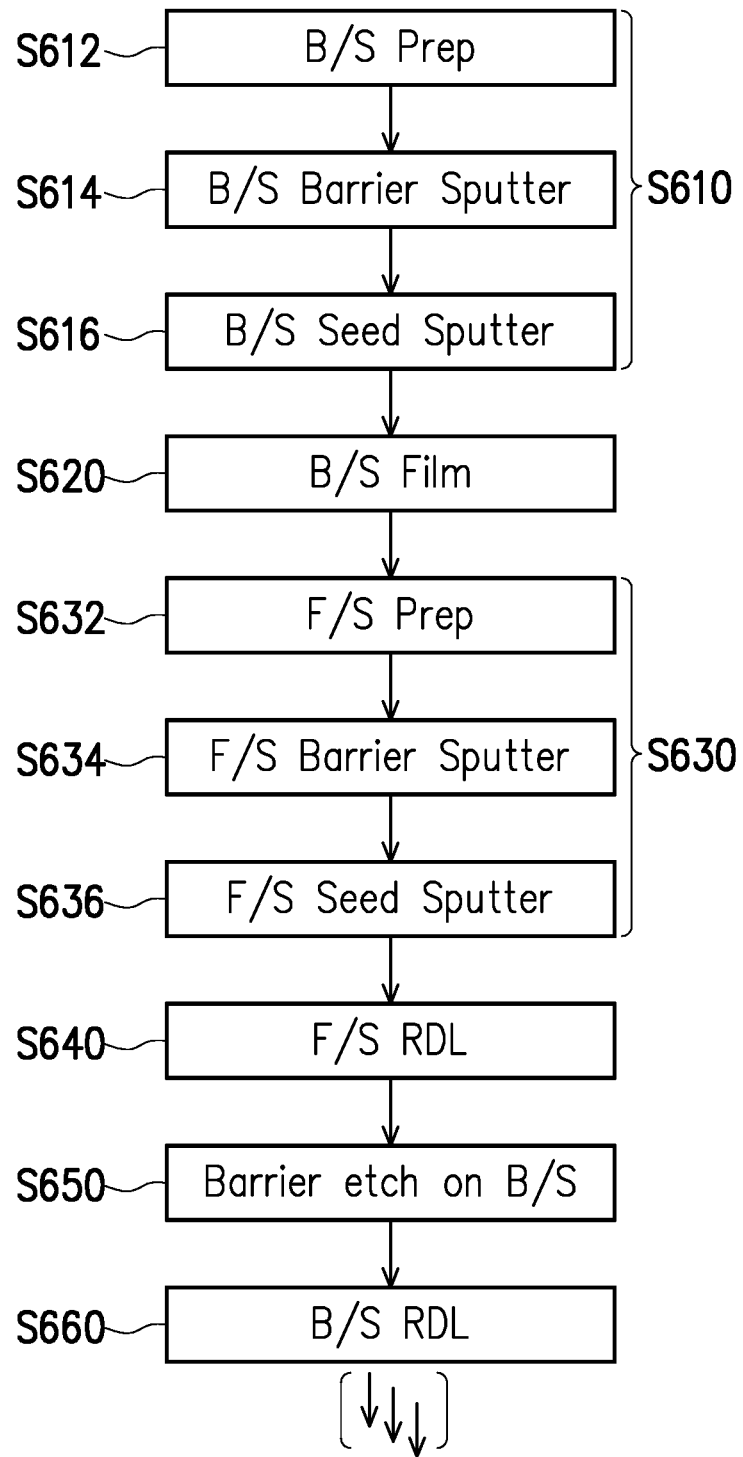
FIG. 4 is a schematic flow chart illustrating some steps of a manufacturing method of a semiconductor package according to some embodiments of the disclosure.
Figure 5A:
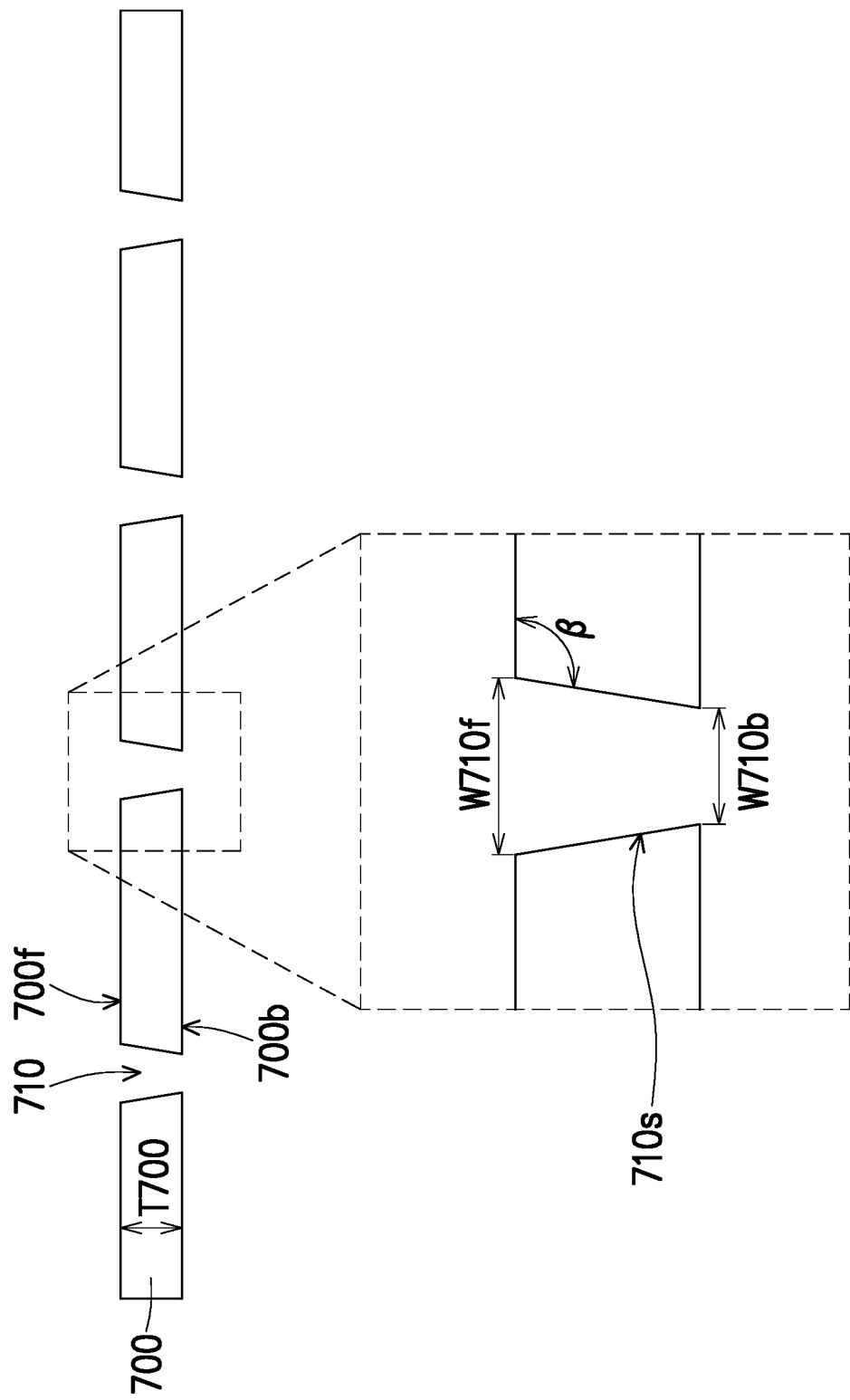

FIG. 4 is a schematic flow chart illustrating some steps of a manufacturing method of a semiconductor package SP14 according to some embodiments of the disclosure. FIG. 5A to FIG. 5N are schematic cross-sectional views illustrating structures formed during a manufacturing process of the semiconductor package SP14 according to some embodiments of the disclosure. In FIG. 5A, a substrate 700 (e.g., an interposer) is provided. In some embodiments, the substrate 700 is a wafer of an inorganic material, and the inorganic material may be selected as described above for the substrate 200 of FIG. 2A.

In some embodiments, through holes 710 are formed in the substrate 700, extending all the way from the frontside surface 700f of the substrate 700 to the opposite backside surface 700b, for the entire thickness T700 of the substrate 700. In some embodiments, the thickness of the substrate 700 is larger than 200 micrometers, 300 micrometers, or even 500 micrometers, for example in the range between 300 micrometers and 1 millimeter. In some embodiments, the through holes 710 are formed by laser drilling, as previously described for the substrate 200 of FIG. 2A, and have tapered sidewalls 710s, so that a width W710f of the through holes 710 at the frontside surface 700f of the substrate 700 is greater than a width W710b of the through holes 710 at the backside surface 700b of the substrate 700. The tapering angle α defined by the frontside surface 700f of the substrate 700 and the sidewalls 710s of the through holes 710 may be greater than 90 degrees, for example in the range between 90 degrees and 120 degrees. In some embodiments, the through holes 710 have a high aspect ratio (e.g., the ratio between the thickness T700 of the substrate and the width W710f of the through holes 710 at the frontside surface 700f of the substrate 700), for example in the range from 1.5 to 5.

In some embodiments, the substrate 700 is introduced in a sputtering chamber to perform a sputtering process from the side of the backside surface 700b (step S610 in FIG. 4). In some embodiments, the sputtering process S610 includes a surface preparation step S612, a barrier layer sputtering step S614 and a seed layer sputtering step S616. In the surface preparation step S612, the backside surface 700b and the sidewalls 710s of the through holes 710 are pre-treated for subsequent material deposition. In some embodiments, a cleaning step, for example via plasma treatment, is performed to remove impurities which may have deposited or otherwise formed on the backside surface 700b and the sidewalls 710s. After cleaning, the sputtering chamber may be brought to the target temperature and pressure for the subsequent sputtering operations.

Figure 5B:
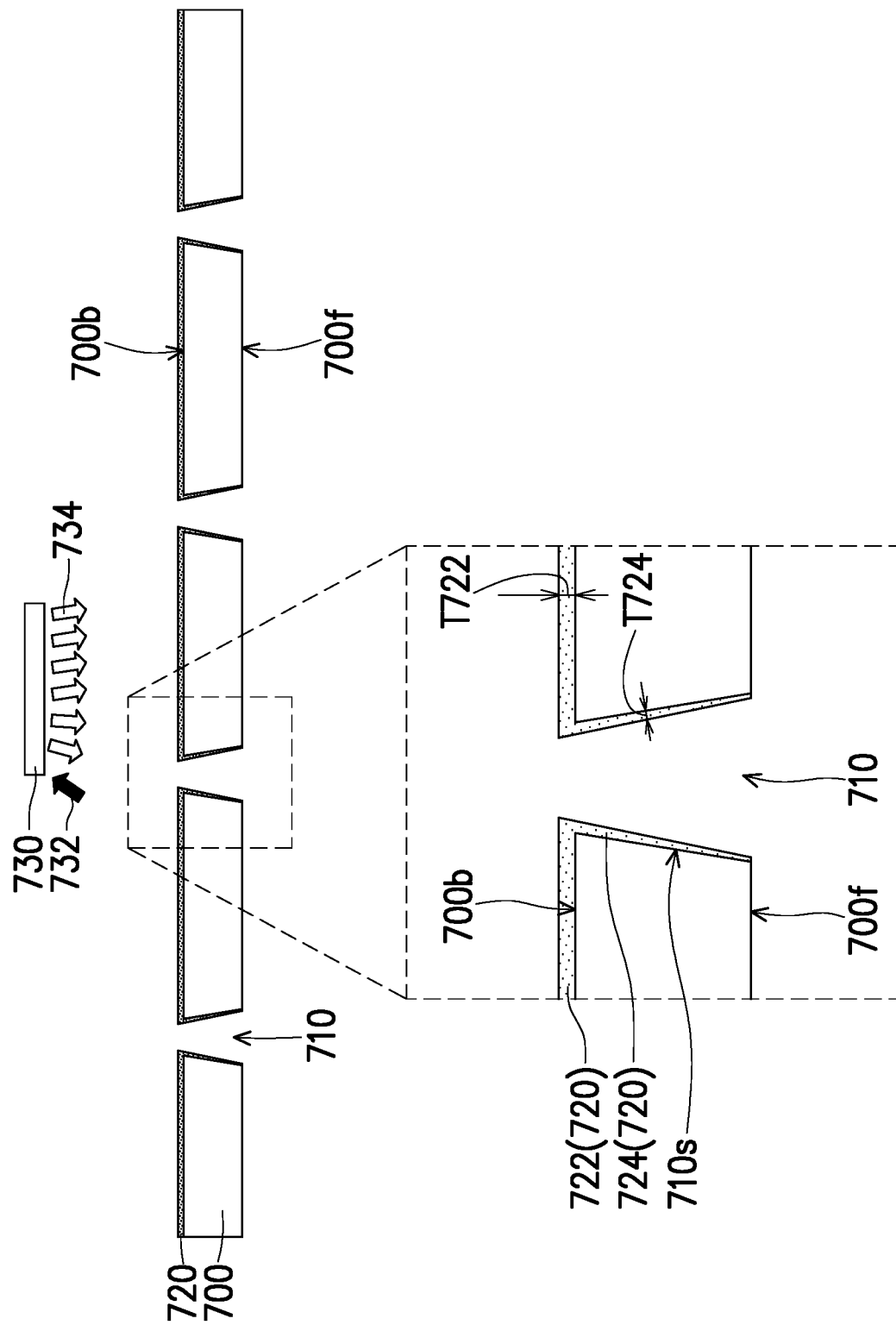

In FIG. 5B, the material of a backside barrier layer 720 is sputtered on the backside surface 700b of the substrate 700 and at least part of the sidewalls 710s of the through holes 710 (step S614 in FIG. 4). For example, one or more sputtering targets 730 are hit with high energy incident atoms or ions 732 to eject sputtered material 734 which is then deposited on the substrate 700. In some embodiments, the pressure of the sputtering chamber and the energy of the incident atoms or ions 732 are selected so that the mean free path of the sputtered material 734 is sufficiently long to deposit on the sidewalls 710s of the through holes 710 close to the front side surface 700f. It should be noted that while a single target 730 is illustrated in FIG. 5B, the disclosure is not limited thereto. For example, depending on the desired composition of the backside barrier layer 720, multiple sputtering targets 730 may be used. In some embodiments, the backside barrier layer 720 includes a metallic material, such as titanium, tantalum, a nitride thereof, or a combination thereof. In some embodiments, the backside barrier layer 720 is a titanium-containing layer, including a titanium-based material such as titanium, titanium nitride, or a combination thereof. In some embodiments, the backside barrier layer 720 is a tantalum-containing layer, including a tantalum-based material such as tantalum, tantalum nitride, or a combination thereof.

In some embodiments, the sputtered material 734 reaches the substrate 700 from the side of the backside surface 700b. The resulting backside barrier layer 720 may thus include sections 722 extending on the backside surface 700b of the substrate 700 and sections 724 extending on the sidewalls 710s of the through holes 710. The thicknesses T722, T724 may be measured along directions normal to the surfaces 700b, 710s on which the corresponding sections 722, 724 of the frontside barrier layer 720 extend. In some embodiments, the sections 722 located on the backside surface 700b may have a substantially constant thickness T722 and the sections 724 located on the sidewalls 710s of the through holes 710 have a decreasing thickness T724 proceeding towards the frontside surface 700f. In some embodiments, the backside barrier layer 720 is formed to have a thickness T722 in the range from 1 micrometer to 10 micrometers.

Figure 5C:
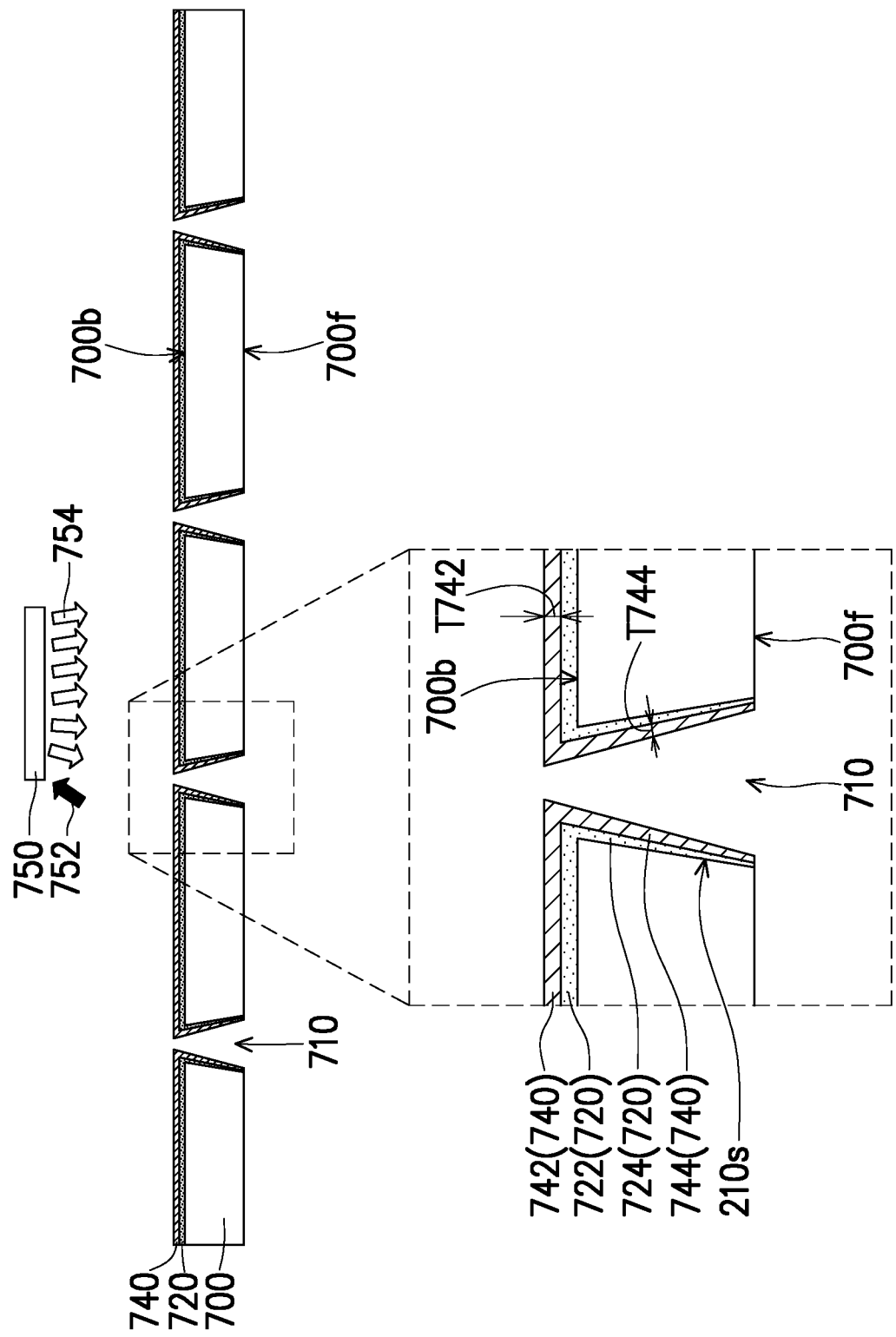

In FIG. 5C, the material of a backside seed layer 740 is sputtered on the backside barrier layer 720 (step S616 in FIG. 4). For example, one or more sputtering targets 750 are hit with high energy incident atoms or ions 752 to eject sputtered material 754 which is then deposited on the backside barrier layer 720. In some embodiments, the pressure of the sputtering chamber and the energy of the incident atoms or ions 752 are selected so that the mean free path of the sputtered material 264 is sufficiently long to form the backside seed layer 740 also on the section 724 of the backside barrier layer 720 on the sidewalls 710s of the through holes 710. It should be noted that while a single target 750 is illustrated in FIG. 5C, the disclosure is not limited thereto. For example, depending on the desired composition of the backside seed layer 740, multiple sputtering targets 750 may be used. In some embodiments, the backside seed layer 740 includes a metallic material, such as copper, silver, gold, nickel, titanium, alloys thereof, a combination thereof, or the like. In some embodiments, the backside seed layer 740 is a copper-containing layer, including copper-based materials such as copper or copper alloys.

In some embodiments, the sputtered material 754 reaches the substrate 700 from the side of the backside surface 700b. The resulting backside seed layer 740 may thus have a shape similar to the one described before for the backside barrier layer 720, including sections 742 extending on the sections 722 over the backside surface 700b of the substrate 700 and sections 744 extending on the sections 724 over the sidewalls 710s of the through holes 710. In some embodiments, the thicknesses T742, T744 of the individual sections 742, 744 of the backside seed layer 740 may become increasingly smaller proceeding from the backside surface 700b to the frontside surface 700f, similar to what was previously described with respect to the backside barrier layer 720. The thicknesses T742, T744 are measured along directions normal to the surfaces 700b, 710s on which the corresponding sections 742, 744 of the backside seed layer 740 extend. So, for example, the sections 742 located over the backside surface 200b may have a substantially constant thickness T742 and the sections 744 located over the sidewalls 710s of the through holes 710 have a decreasing thickness T744 proceeding towards the frontside surface 700f. In some embodiments, the backside seed layer 740 is formed to have a thickness T742 in the range from 1 micrometer to 10 micrometers. In some embodiments, the backside barrier layer 720 may decrease or even prevent diffusion of the material of the backside seed layer 740 into the substrate 700.

Figure 5D:
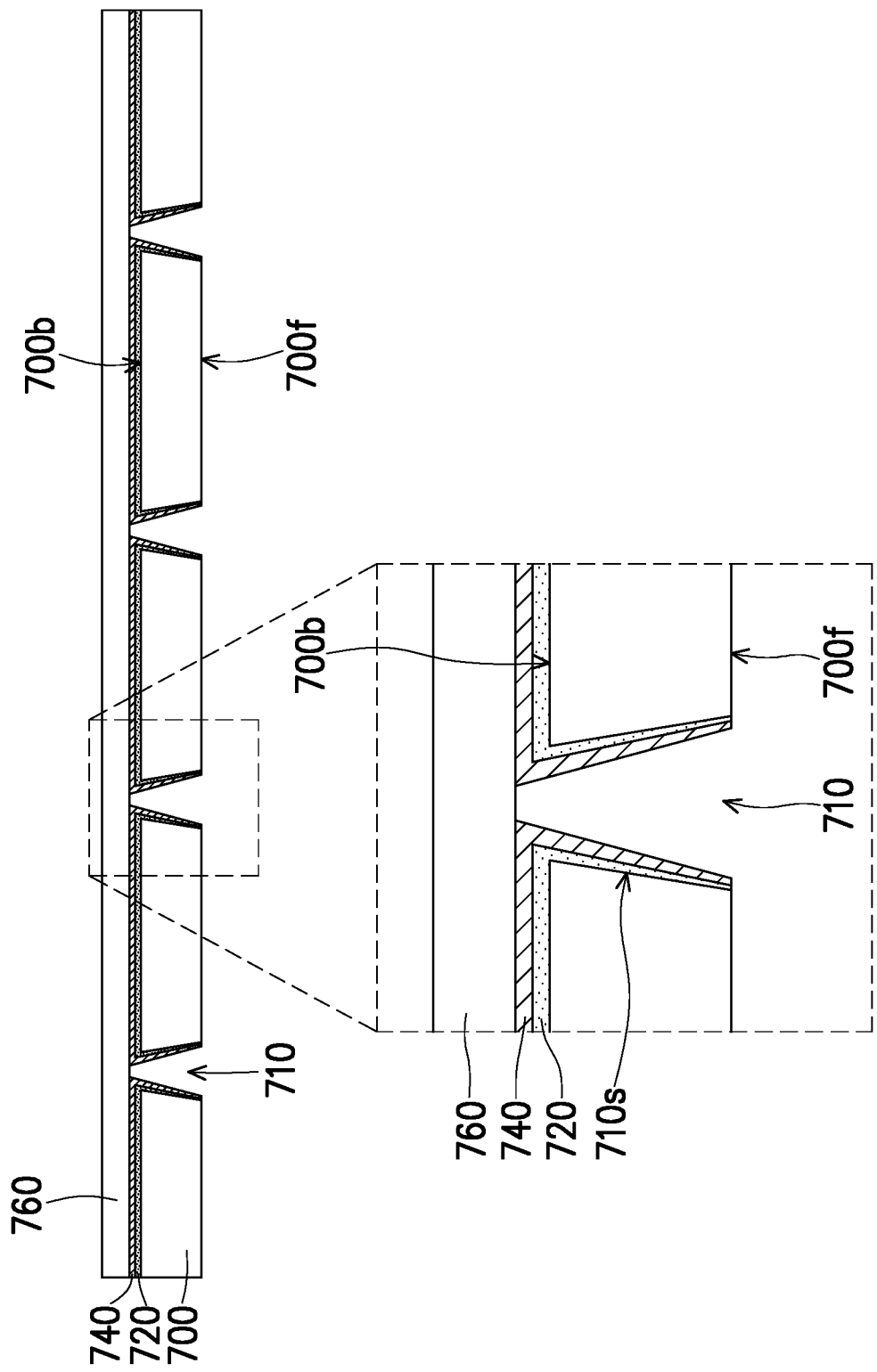

In some embodiments, once the backside barrier layer 720 and the backside seed layer 740 are formed, the substrate 700 may be taken out of the sputtering chamber for further processing. In some embodiments, after the sputtering process S610 is performed on the backside surface 700b of the substrate 700, the through holes 710 may still be open at both ends, i.e., at the side of both the frontside surface 700f and the backside surface 200b. In FIG. 5D, a backside film 760 is bonded to the backside surface 700b of the substrate 700 (step S620 in FIG. 4). The backside film 760 may be selected from similar options as described above for the backside film 220 of FIG. 2B. In some embodiments, the backside film 760 is adhered to the backside seed layer 740, covering most or all of the backside surface 700b. Most notably, the backside film 760 extends at the bottom (the narrower ends) of the through holes 710, so that the through holes 710 are plugged at the side of the backside surface 700b where the backside barrier layer 720 and the backside seed layer 740 have been formed. That is, the through holes 710 may in fact be masked as blind holes by way of the backside film 760.

In some embodiments, the substrate 700 with the backside barrier layer 720 and the backside seed layer 740 formed thereon and the backside film 760 bonded thereto is introduced in a sputtering chamber to perform a sputtering process from the side of the frontside surface 700f (step S630 in FIG. 4). In some embodiments, the sputtering process S630 includes a surface preparation step S632, a barrier layer sputtering step S634, and a seed layer sputtering step S636. In the preparation step S632, the frontside surface 700f of the substrate and the backside seed layer 740 on the sidewalls 710s of the through holes 710 are pre-treated for subsequent material deposition. In some embodiments, the preparation step S632 includes a cleaning step, for example via plasma treatment, which cleaning step is performed to remove impurities deposited or otherwise formed, such as oxidation impurities of the material of the backside seed layer 740. After cleaning, the sputtering chamber may be brought to the target temperature and pressure for the subsequent sputtering operations.

Figure 5E:
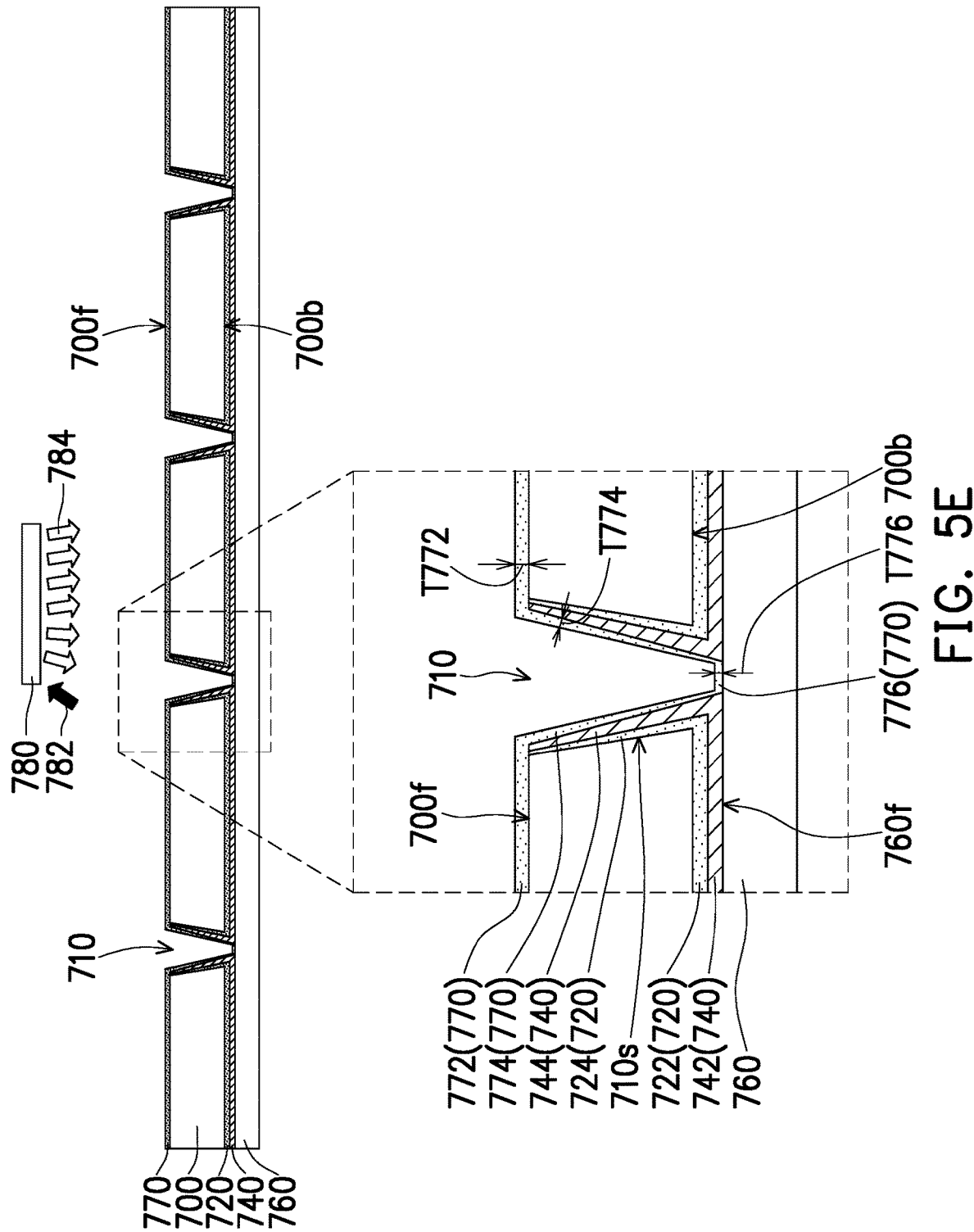

In FIG. 5E, the material of a frontside barrier layer 770 is sputtered on the frontside surface 700f of the substrate 700 and on the backside seed layer 740 on the sidewalls 710s of the through holes 710 (step S634 in FIG. 4). For example, one or more sputtering targets 780 are hit with high energy incident atoms or ions 782 to eject sputtered material 784 which is then deposited on the substrate 700. In some embodiments, the pressure of the sputtering chamber and the energy of the incident atoms or ions 782 are selected so that the mean free path of the sputtered material 784 is sufficiently long to form the frontside barrier layer 770 also on the backside film 760 at the bottom of the through holes 710. It should be noted that while a single target 780 is illustrated in FIG. 5E, the disclosure is not limited thereto. For example, depending on the desired composition of the frontside barrier layer 770, multiple sputtering targets 780 may be used. In some embodiments, the frontside barrier layer 770 includes a metallic material, such as titanium, tantalum, a nitride thereof, or a combination thereof. In some embodiments, the frontside barrier layer 770 is a titanium-containing layer, including a titanium-based material such as titanium, titanium nitride, or a combination thereof. In some embodiments, the frontside barrier layer 770 is a tantalum-containing layer, including a tantalum-based material such as tantalum, tantalum nitride, or a combination thereof. In some embodiments, the backside barrier layer 720 and the frontside barrier layer 770 have substantially the same composition.

In some embodiments, the sputtered material 784 reaches the substrate 700 from the side of the frontside surface 700f. The resulting frontside barrier layer 770 may thus include sections 772 extending on the frontside surface 700f of the substrate 700, sections 774 extending on sections 744 of the backside seed layer 740 on the sidewalls 710s of the through holes 710, and sections 776 extending at the bottom of the through holes 710 on the frontside surface 760f of the backside film 760. In some embodiments, the thicknesses T772, T774, T776 of the individual sections 772, 774, 776 of the frontside barrier layer 770 may become increasingly smaller proceeding from the frontside surface 700f to the backside surface 700b. The thicknesses T772, T776 may be measured along a direction normal to the surface 700f, and the thickness T774 may be measured along a direction normal to the surface 710s. So, for example, the sections 772 located on the frontside surface 700f may have a substantially constant thickness T772 and the sections 774 located on the sidewalls 710s of the through holes 710 have a decreasing thickness T774 proceeding towards the backside surface 200b. The sections 776 at the bottom of the through holes 710 may have a thickness T776 comparable to the thickness T774 of the sections 774 in proximity of the bottom surface 700b. In some embodiments, the thickness T776 of the sections 776 may be slightly larger towards the center of the through holes 710 than closer to the sidewalls 710s. In some embodiments, the frontside barrier layer 770 is formed to have a thickness T772 in the range from 1 micrometer to 10 micrometers.

Figure 5F:
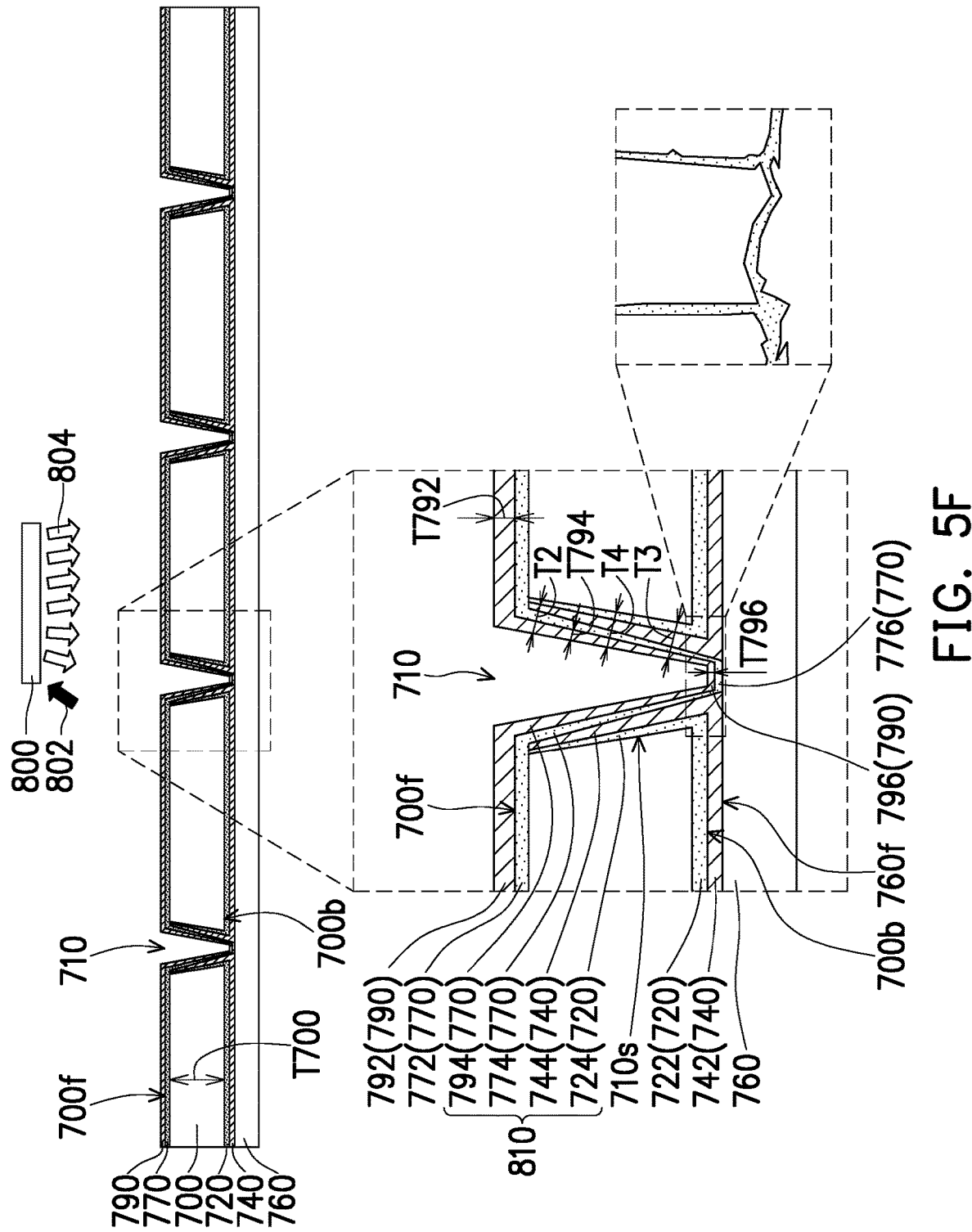

In FIG. 5F, the material of a frontside seed layer 790 is sputtered on the frontside barrier layer 770 (step S636 in FIG. 4). For example, one or more sputtering targets 800 are hit with high energy incident atoms or ions 802 to eject sputtered material 804 which is then deposited on the frontside barrier layer 770. In some embodiments, the pressure of the sputtering chamber and the energy of the incident atoms or ions 802 are selected so that the mean free path of the sputtered material 804 is sufficiently long to form the frontside seed layer 790 also on the section 776 of the frontside barrier layer 770 at the bottom of the through holes 710. It should be noted that while a single target 800 is illustrated in FIG. 5F, the disclosure is not limited thereto. For example, depending on the desired composition of the frontside seed layer 790, multiple sputtering targets 800 may be used. In some embodiments, the frontside seed layer 790 includes a metallic material, such as copper, silver, gold, nickel, titanium, alloys thereof, a combination thereof, or the like. In some embodiments, the frontside seed layer 790 is a copper-containing layer, including copper-based materials such as copper or copper alloys. In some embodiments, the backside seed layer 740 and the frontside seed layer 790 have substantially the same composition.

In some embodiments, the sputtered material 804 reaches the substrate 700 from the side of the frontside surface 700f. The resulting frontside seed layer 790 may thus have a shape similar to the one described before for the frontside barrier layer 770, including sections 792 extending on the sections 772 over the frontside surface 700f of the substrate 700, sections 794 extending on the sections 774 over the sidewalls 710s of the through holes 710, and sections 796 extending on the sections 776 at the bottom of the through holes 710 over the frontside surface 760f of the backside film 760. In some embodiments, the thicknesses T792, T794, T796 of the individual sections 792, 794, 796 of the frontside seed layer 790 may become increasingly smaller proceeding from the frontside surface 700f to the backside surface 700b of the substrate 700, similar to what was previously described with respect to the frontside barrier layer 770. The thicknesses T792, T796 may be measured along a direction normal to the surface 700f, and the thickness T794 may be measured along a direction normal to the surface 710s. So, for example, the sections 792 located over the frontside surface 700f may have a substantially constant thickness T792 and the sections 794 located over the sidewalls 710s of the through holes 710 have a decreasing thickness T794 proceeding towards the backside surface 700b. The sections 796 at the bottom of the through holes 710 may have a thickness T796 comparable to the thickness T794 of the sections 794 in proximity of the bottom surface 700b. In some embodiments, the thickness T796 of the sections 796 may be slightly larger towards the center of the through holes 710 than closer to the sidewalls 710s. In some embodiments, the frontside seed layer 790 is formed to have a thickness T792 in the range from 1 micrometer to 10 micrometers. In some embodiments, the frontside barrier layer 770 may decrease or even prevent diffusion of the material of the frontside seed layer 790 into the substrate 700.

In some embodiments, by sputtering the material of the backside barrier layer 720 and of the backside seed layer 740 from the side of the backside surface 700b and the material of the frontside barrier layer 770 and of the frontside seed layer 790 from the side of the frontside surface 700f, a composite seed-barrier layer 810 is formed along the sidewalls 710s of the through holes 710 by the sections 724, 744, 774, 794 of the barrier layers 720, 770 and the seed layers 740, 790 extending along the sidewalls 710s. In some embodiments, the dual-side sputtering process just described results in good coverage of the surfaces 700b, 700b, 710s of the substrate 700, even when the through holes 710 have a high aspect ratio. In some embodiments, an indication of the degree of the coverage may be obtained by comparing the thicknesses T2-T4 of the composite seed-barrier layer 810 at its thickest (e.g., T2 or T3) and thinnest (e.g., T4) points, where the thicknesses T2-T4 correspond to combined thicknesses of the barrier layers 720, 770 and seed layers 740, 790. For example, at regions closer to the frontside surface 700f or backside surface 700b, the thicknesses T2 and T3 of the composite seed-barrier layer 810 may be greater than the thickness T4 of the composite seed-barrier layer 810 at about the middle of the through holes 710 (e.g., at about half of the thickness T700 of the substrate 700). In some embodiments, the ratio of the thickness T4 to the thickness T2 or T3 (whatever is greater) may be in the range from 0.05 to 0.8 or more, also as a function of the aspect ratio of the through holes 710. By way of example and not of limitation, when the aspect ratio of the through holes 710 is about 1.5, the ratio of the thicknesses T4 to the thickness T2 or T3 may be about in the range from 0.5 to 0.8; when the aspect ratio of the through holes 710 is about 3, the ratio of the thickness T4 to the thickness T2 or T3 may be about in the range from 0.15 to 0.5; and when the aspect ratio of the through holes 710 is about 5, the ratio of the thickness T4 to the thickness T2 or T3 may be about in the range from 0.05 to 0.4.

In some embodiments, because a backside film 760 is installed on the backside surface 700b after depositing the backside barrier layer 720 and the backside seed layer 740, the material of the frontside barrier layer 770 and the frontside seed layer 790 also extends at the bottom of the through holes 710 as if they were blind holes. In the secondary inset in FIG. 5F, is shown a schematic cartoon of the spatial intensity distribution of the energy disperse signal (EDS) of the material of the frontside seed layer 790 at the bottom of the through holes 710. In the example shown in the inset, the frontside seed layer 790 is a copper-containing layer, and the EDS signal observed is the one of copper. As can be seen from the inset of FIG. 5F, a continuous copper signal spanning the distance between opposite sidewalls 710s at the bottom of the through holes 710 can be observed, indicating that the frontside seed layer 790 also extends at the bottom of the through holes 710. In some embodiments, as a result of the dual-side sputtering process, the composite seed-barrier layer 810 may present different microstructures according to the level height with respect to the thickness direction of the substrate 700. For example, along the sidewalls 710s of the through holes 710 in proximity of the backside surface 700b, the composite seed-barrier layer 810 may present a stratified structure, with the section 724 of the backside barrier layer 720, the section 744 of the backside seed layer 740, the section 772 of the frontside barrier layer 770 and the section 792 of the frontside seed layer 790 sequentially stacked over each other; in the middle region of the substrate 700 (e.g., at a level height corresponding to about half of the thickness T700), the section 744 of the backside seed layer 740 may exist discontinuously, as inclusions of seed material surrounded by the barrier material of the backside barrier layer 720 and the frontside barrier layer 770. Such inclusions of seed material may have a size in a range from about 0.05 micrometers to about 1 micrometer. The frontside seed layer 790 may then continuously extend on the frontside barrier layer 770 over the inclusions of seed material.

Figure 5G:
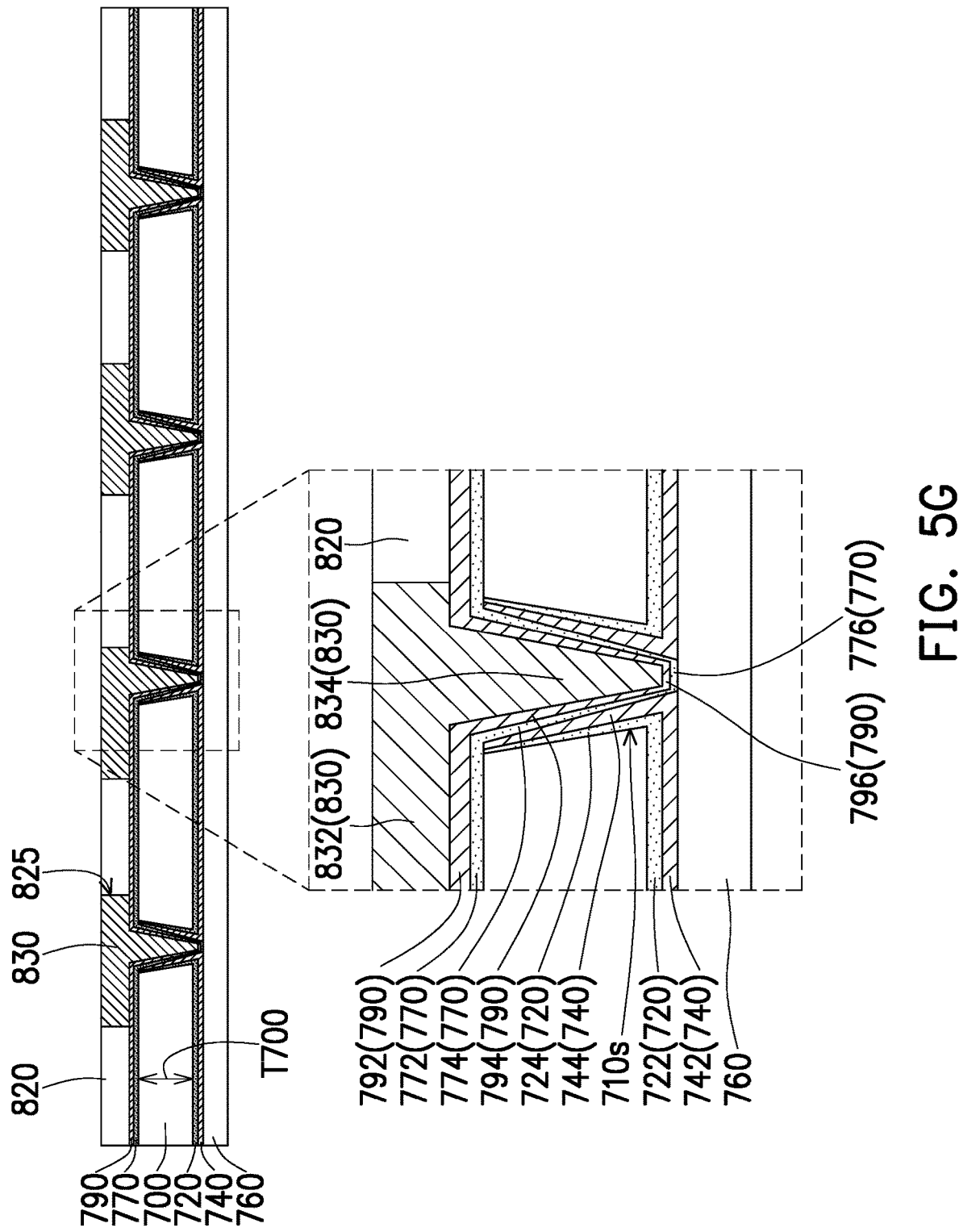
Figure 5I:
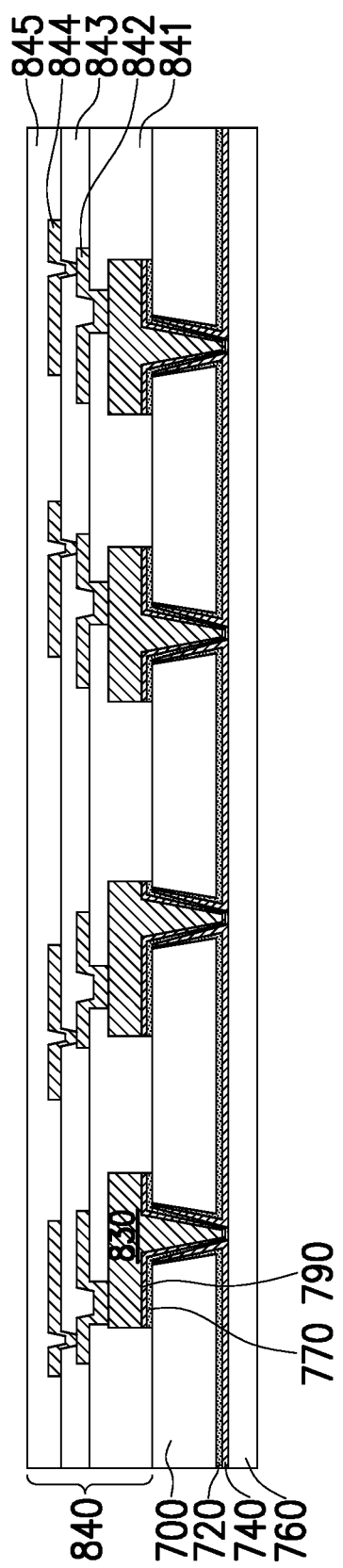

In some embodiments, once the frontside barrier layer 770 and the frontside seed layer 790 are formed, the substrate 700 may be taken out of the sputtering chamber for further processing. For example, as illustrated in FIG. 5G to FIG. 5I, a frontside RDL 840 may be formed on the frontside surface 700f (step S640 in FIG. 4). In FIG. 2G, a patterned mask 820 including openings 825 in correspondence of the through holes 710 is formed on the frontside seed layer 790, with similar material and processes as previously described for the patterned mask 270 with reference to FIG. 2E. Then, a conductive material is filled in the openings 825 and the through holes 710 to form the patterned conductive traces 830, with similar material and processes as previously described for the patterned conductive traces 830 of FIG. 2F. In some embodiments, the patterned conductive traces 830 include routing patterns 832 extending on the horizontal sections 792 of the frontside seed layer 790, and routing vias 834 filling the through holes 710 in between the sidewalls 710s. The routing vias 834 may extend from the level height of the sections 792 (at the bottom of the routing patterns 832) to the sections 796 of the frontside seed layer 790 extending on the backside film 760. The routing vias 834 may be integrally formed with the routing patterns 832.

Referring to FIG. 5G and FIG. 5H, the patterned mask 820 and the underlying portions of the frontside seed layer 790 and the frontside barrier layer 770 are removed, for example via stripping, ashing, and/or etching, as previously described with reference to FIG. 2G. The frontside seed layer 790 and the frontside barrier layer 770 still remain on the frontside surface 700f of the substrate 700 underneath the patterned conductive traces 830. In some embodiments, the patterned conductive traces 830 may be formed with routing patterns 832 having a thickness T832 in the range from 50 micrometers to 150 micrometers. Elsewhere, the frontside surface 700f of the substrate 700 may be (temporarily) exposed. In FIG. 5I, the dielectric layers 841, 843, 845 and the conductive layers 842, 844 of the frontside RDL 840 are formed as previously described with reference to FIG. 2H and FIG. 2I.

Referring to FIG. 5I to FIG. 5M, in some embodiments, a backside RDL 890 may be formed on the backside surface 700b (step S650 in FIG. 4). For example, in FIG. 5J a carrier 850 is detachably bonded to the uppermost dielectric layer 845 of the frontside RDL 840, with similar material and processes as previously described for the carrier 350 of FIG. 2J. The backside film 760 is removed (e.g., peeled) away from the backside surface 700b of the substrate 700, thus exposing the sections 742 of the backside seed layer 740. In correspondence of the through holes 710, the sections 776 of the frontside barrier layer 770 are exposed in between the sections 742 of the backside seed layer 740, substantially coplanar with the backside seed layer 740. The underlying sections 796 of the frontside seed layer 790 may be substantially coplanar with the sections 722 of the backside barrier layer 720.

Figure 5J:
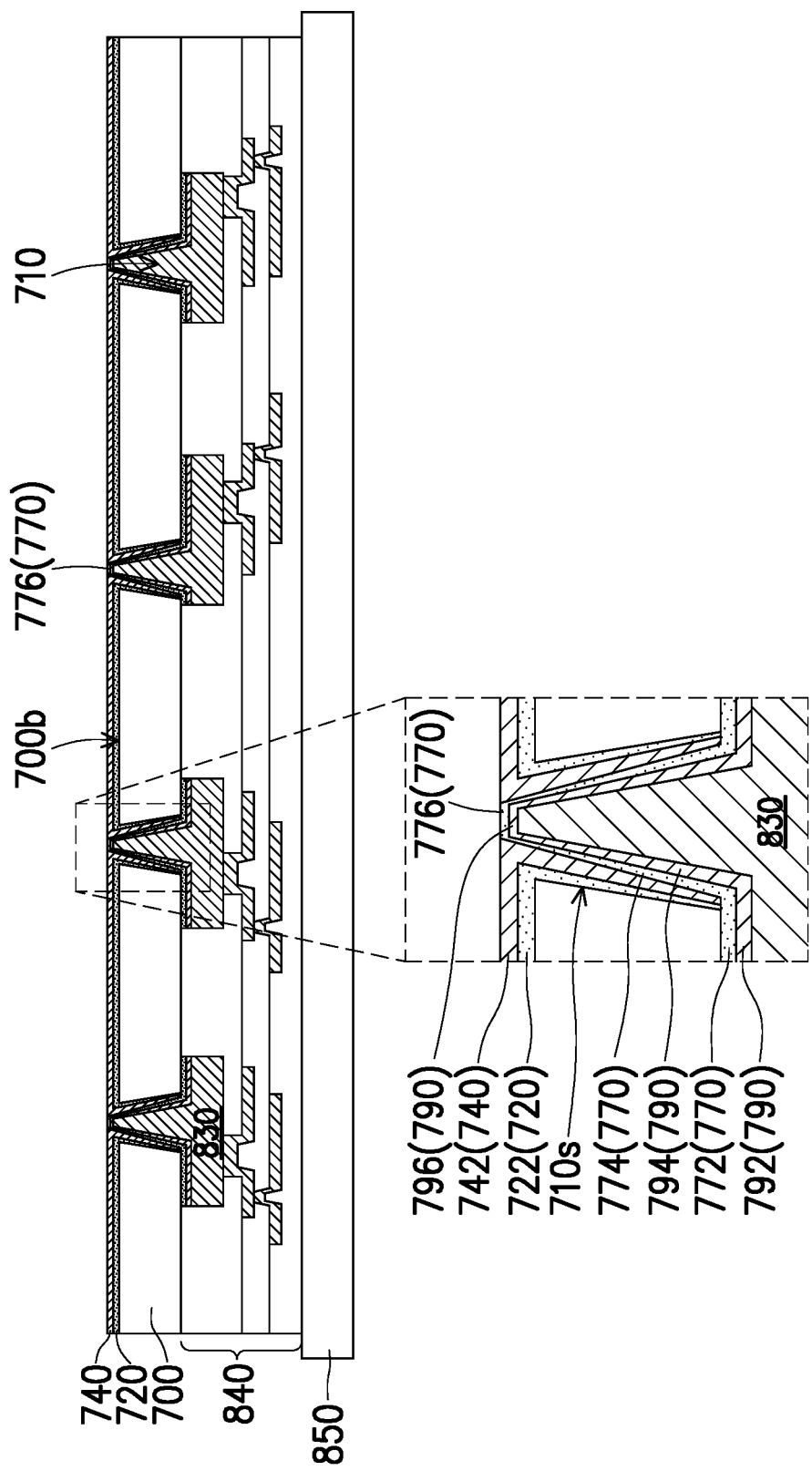
Figure 5K:
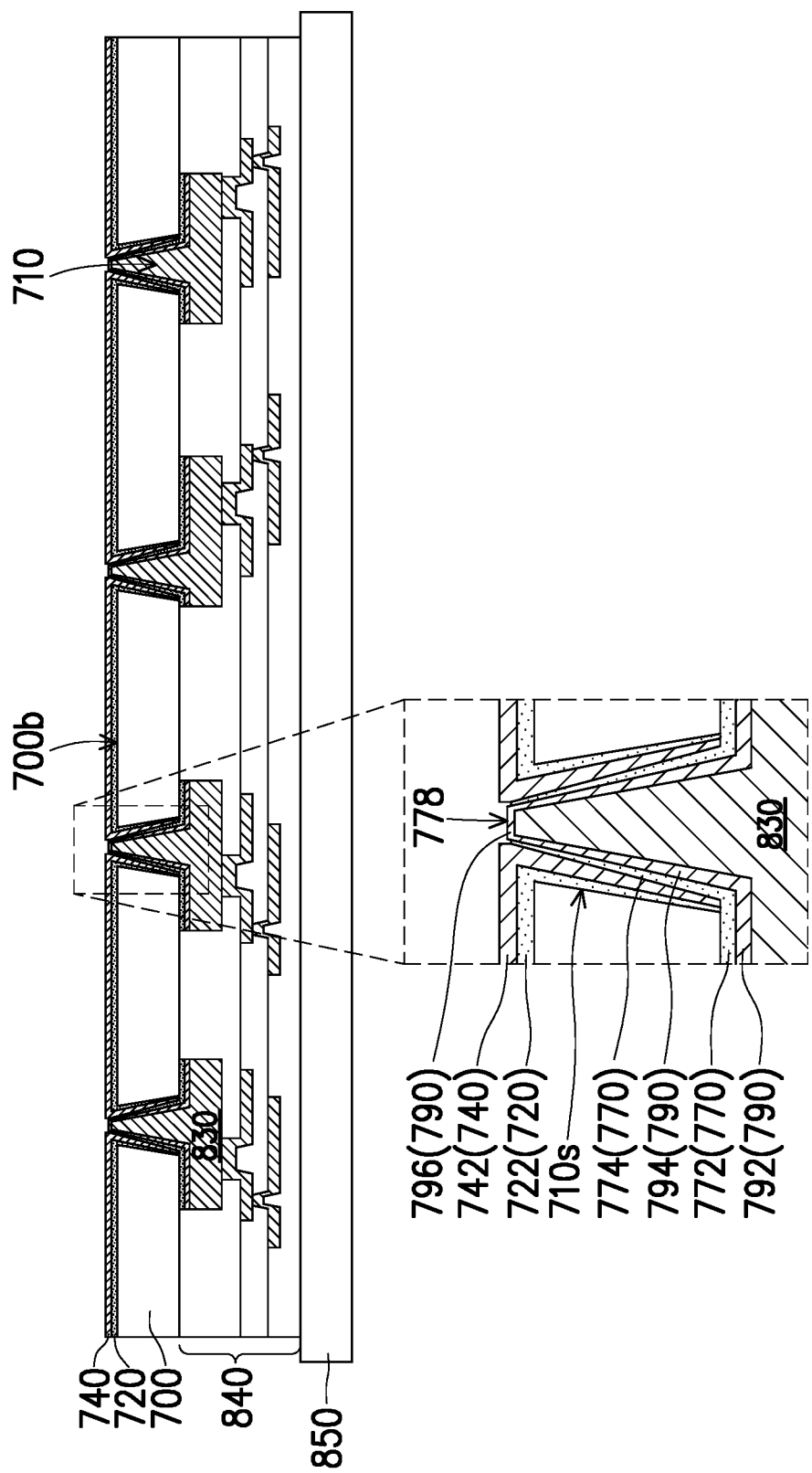

Referring to FIG. 5J and FIG. 5K, in some embodiments the sections 776 of the frontside barrier layer 770 are removed, for example via one or more etching steps (step 650 in FIG. 4). For example, difference in compositions between the frontside barrier layer 770 and the frontside seed layer 790 as well as the backside seed layer 740 may be such that different etching rates are observed for the frontside barrier layer 770 and the seed layers 740 and 790, thus allowing selective removal of the material of the frontside barrier layer 770 in correspondence of the bottoms of the through holes 710. Upon removal of the sections 776 of the frontside barrier layer 770, a recess 778 is formed on the side of the backside surface 200b in correspondence of the through holes 710. In some embodiments, the sections 796 of the frontside seed layer 790 are exposed at the bottom of the recess 778, while the backside seed layer 740 may laterally encircle the recess 778. That is, seed material may be exposed at the sides and the bottom of the recess 778. In some embodiments, depending on the etching conditions and the materials used for the frontside barrier layer 770 and the frontside seed layer 790, the conductive material of the patterned conductive traces 830 may be exposed at the bottom of the recess 778. In some embodiments, materials from the sections 774 of the frontside barrier layer 770 may also be removed during the etching process, for example if the sections 774 of the frontside barrier layer 770 were formed to extend all the way up to the removed section 776.

Figure 5L:
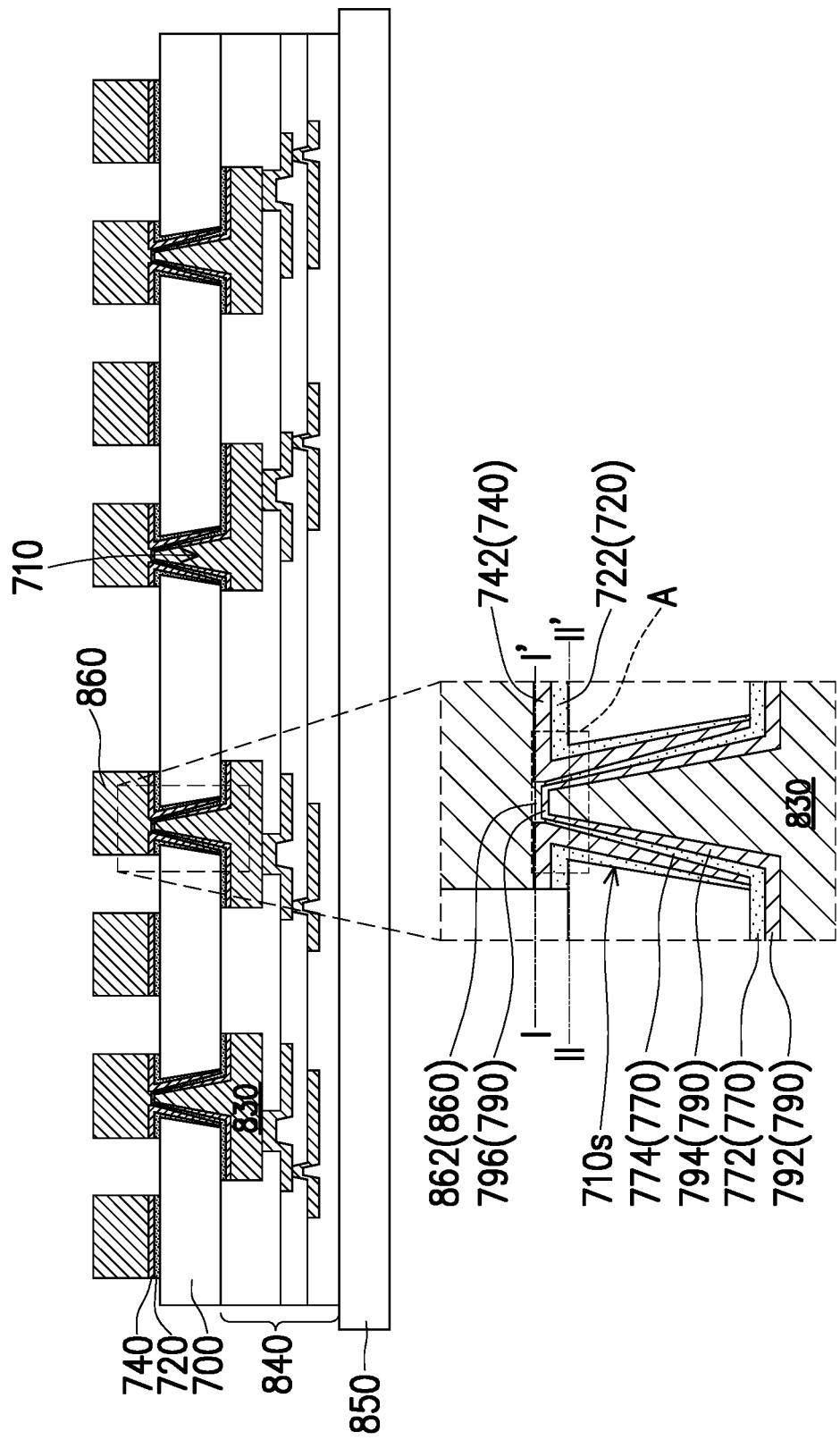

Referring to FIG. 5K and FIG. 5L, conductive blocks 860 are formed on the backside seed layer 740 following a similar process as previously described for the conductive blocks 410 with reference to FIG. 2N and FIG. 2O. The conductive blocks 860 may be routing patterns extending on the backside seed layer 740, electrically connected (via the respective seed layers 740, 790 and barrier layers 720, 770) to the conductive traces 830 filling the through holes 710. The portions of backside seed layer 740 and backside barrier layer 720 not covered by the conductive blocks 860 are removed to expose the backside surface 700b of the substrate 700, similar to what was previously described with reference to FIG. 2N, while portions of the backside seed layer 740 and the backside barrier layer 720 remains at the bottom of the conductive blocks 860. As illustrated in the inset of FIG. 5L, the conductive blocks 860 may include protrusions 862 filling the recesses 778 and directly contacting the frontside seed layer 790 (or even the patterned conductive traces 830). In some embodiments, by removing the portions of the frontside barrier material from the side of the backside surface 700*b* before forming the conductive blocks 860, lower resistance contacts may be established between the patterned conductive traces 830 and the conducive blocks 860. In particular, only seed material (e.g., from the frontside seed layer 790 and/or the backside seed layer 740) may extend between conductive blocks 860 and the patterned conductive traces 830. In some embodiments, the seed material and the conductive material used for the conductive blocks 860 and the patterned conductive traces 830 include the same elements (e.g., they are all copper-containing material, aluminum-containing materials, or the like), and interfaces between such materials may not necessarily be visible (for example, via TEM or SEM).

Figure 5M:
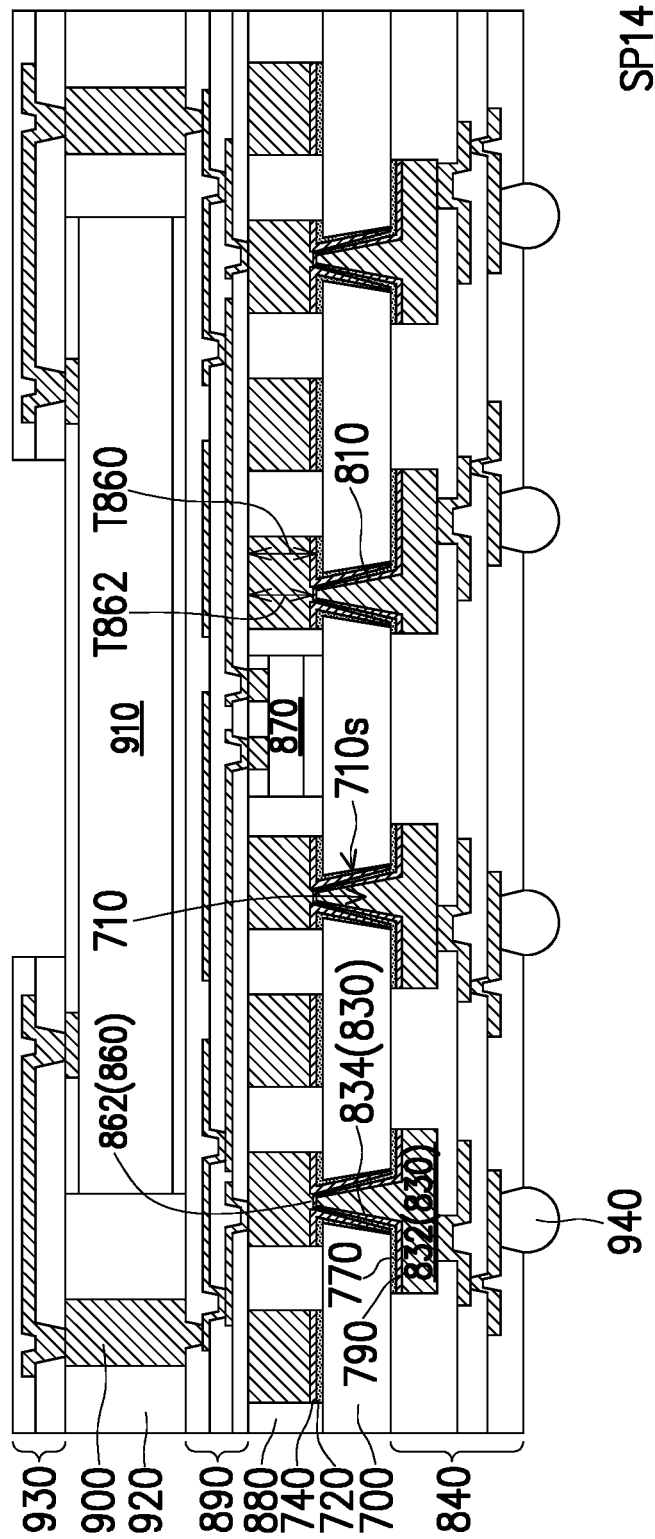

In some embodiments, the semiconductor package SP14 of FIG. 5M may be obtained from the structure illustrated in FIG. 5L following similar processes as previously described with reference to FIG. 2O to FIG. 2U. Briefly, a semiconductor die 870 may be disposed on the substrate 700 amongst the conductive blocks 860, as previously described for the semiconductor die 420. In some embodiments, the semiconductor die 870 is a logic die, such as a signal processing die. In some embodiments, the conductive blocks 860 are formed of a thickness T860 comparable to the semiconductor die 870, for example greater than 100 micrometers, such as in the range from 100 micrometers to 250 micrometers. The thickness T860 may be measured in regions of the conductive blocks 860 extending over the substrate 700 (e.g., rather than in correspondence of the through holes 710). In some embodiments, the conductive blocks 860 have a thickness T862 greater than the thickness T860 where the protrusions 862 are formed, in correspondence of the through holes 710.

In some embodiments, the encapsulant 880 may be formed on the substrate 700 to laterally wrap the conductive blocks 860 and the semiconductor die 870. The backside RDL 890 may then be formed on the encapsulated semiconductor die 870, electrically contacting the semiconductor die 870 and connecting the semiconductor die 870 to the conductive blocks 860. Through insulator vias 900 are then formed on the backside RDL 890, on an opposite side of the backside RDL 890 with respect to the semiconductor die 870 and the conductive blocks 860. A semiconductor die 910 may be bonded on the backside RDL 890 amongst the TIVs 900. The semiconductor die 910 may be a microelectromechanical system, capable of sensing external stimuli such as radiation, sound waves, touch, pressure, or the like. The semiconductor die 910 and the TIVs 900 may be encapsulated in the encapsulant 920, and the additional RDL 930 may then be formed. The RDL 930 may leave exposed a sensing area of the semiconductor die 910. The semiconductor die 910 may be connected to the conductive blocks 860 and the semiconductor die 870 via the RDLs 890, 930 and the TIVs 900, so that signals generated by the semiconductor die 910 in response to detected external stimuli may be transmitted to the semiconductor die 870 for further processing. Conductive terminals 940 may be installed on the frontside RDL 840 at an opposite side with respect to the substrate 700, to integrate the semiconductor package SP14 within larger devices.

Based on the process just described, it is possible to form semiconductor packages SP14 in which the redistribution structures (e.g., the frontside RDL 840 and the backside RDL 890 with the conductive blocks 860) at opposite sides of the substrate 700 are interconnected by through substrate vias (e.g., the routing vias 834) formed in through holes 710 of the substrate 700. In some embodiments, a composite seed-barrier layer 810 is formed on the sidewalls 710*s* of the through holes 710, by sputtering the backside barrier layer 720 and the backside seed layer 740 from the one side of the substrate 700, and sputtering the frontside barrier layer 770 and the frontside seed layer 790 from the opposite side of the substrate 700. By doing so, adequate coverage may be achieved even when the through holes 710 have a high aspect ratio, so that the composite seed-barrier layer 810 may effectively seed the deposition of the conductive material of the routing vias 834 while enhancing adhesion to the substrate 700. Furthermore, by including barrier material along the sidewalls 710*s*, out-diffusion of the conductive material to the substrate 700 may also be prevented or reduced. What is more, by temporarily masking the through holes 710 as blind holes by way of the backside film 760 (illustrated, e.g., in FIG. 5D) after sputtering on one side of the substrate 700, the plating steps at opposite sides of the substrate 700 may be performed at different manufacturing stages. This allows not only to build asymmetrical redistribution structures at the opposite sides of the substrate 700, but also to use, for example, single-side plating tools rather than double-side plating tools. In some embodiments, the routing pattern 832 of the bottommost layer of the frontside RDL 840 are integrally formed with the routing vias 834 (e.g., without an intervening barrier layer), thus lowering the resistance of the electrical connection. Furthermore, by removing the frontside barrier layer 770 from the bottom of the through holes 710 before forming the conductive blocks 860, the conductive material of the conductive blocks 860 directly contacts the seed material of the frontside seed layer 790 or the routing via 834, thus further lowering the contact resistance. That is, redistribution structures on both sides of the substrate 700 may be electrically connected without interposed barrier material, even though some barrier material still extends along the sidewalls 710*s* of the substrate 700, thus reducing or preventing out-diffusion of conductive material in the substrate 700. In some embodiments, the conductive blocks 860 may present protrusions 862 in correspondence of the through holes 710.

Figure 6B:
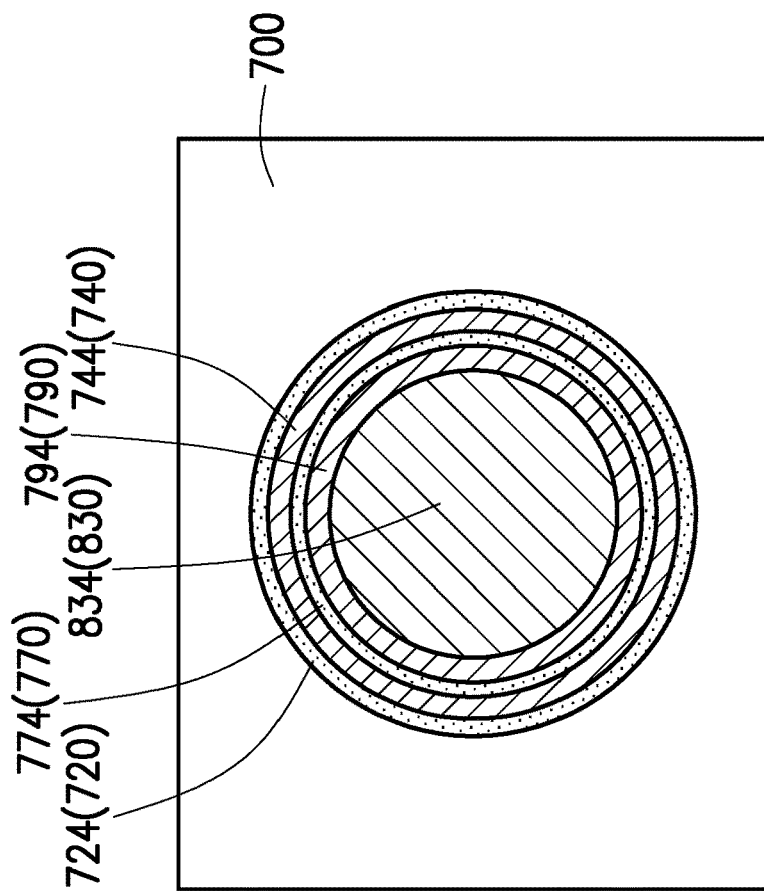
FIG. 6A and FIG. 6B are schematic cross-sectional views of regions of a semiconductor package according to some embodiments of the disclosure.
Figure 6A:
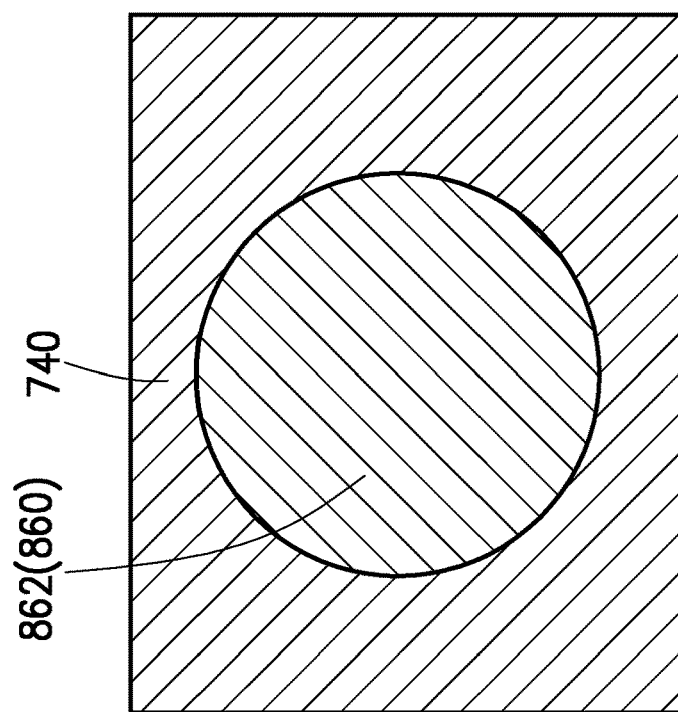

FIG. 6A and FIG. 6B are schematic cross-sectional views of regions of the semiconductor package SP14 according to some embodiments of the disclosure. The views of FIG. 6A and FIG. 6B have been taken in a plane perpendicular to the plane of view of FIG. 5L, in correspondence of the region A illustrated in FIG. 5L, and at level height corresponding to the lines I-I' and respectively. In some embodiments, the level height I-I' may extend across the recess 778, while the level height II-IF may be further towards the middle of the substrate 700. Referring to FIG. 6A, at the tip of the protrusion 862 is encircled by the backside seed layer 740. The protrusion 862 may have a substantially circular footprint, depending on the profile of the through holes 710, which, for example, may be shaped as truncated cones. The disclosure, however, is not limited to such shape, and rectangular or other polygonal profiles are also possible for the ends of the through holes 710. At the level height illustrated in FIG. 6B, the routing via 834 is encircled by the section 794 of the frontside seed layer 790. Proceeding from the routing via 834 towards the substrate 700, the frontside seed layer 790, the frontside barrier layer 770, the backside seed layer 740 and the backside barrier layer 720 may appear as concentric regions (e.g. concentric annular regions in FIG. 6B). That is, even if some barrier material is removed from the side of the backside surface 200*b*, the sections 774 of the frontside barrier layer 740 may remain further along the sidewalls 710s of the through holes 710. At the level height of the line the radial width of the backside barrier layer 720 may be larger than the radial width of the frontside barrier layer 770. Similarly, the radial width of the backside seed layer 740 may be larger than the radial width of the frontside seed layer 790. Depending on the materials used for the seed layers 740, 790, the conductive blocks 860, and the patterned conductive traces 830, interfaces between the seed layers 740, 790 and the conductive blocks 860 or the patterned conductive traces 830 may or may not be visible.

In accordance with some embodiments of the disclosure, a semiconductor package includes a substrate, a first barrier layer, a second barrier layer, a routing via, a first routing pattern, a second routing pattern, and a semiconductor die. The substrate has a through hole formed therethrough. The through hole has a tapered profile. The through hole is wider at a frontside surface of the substrate than at a backside surface of the substrate. The backside surface of the substrate is opposite to the frontside surface. The first barrier layer extends on the backside surface of the substrate. The second barrier layer extends along tapered sidewalls of the through hole and on the frontside surface of the substrate. The routing via fills the through hole and is separated from the tapered sidewalls of the through hole by at least the second barrier layer. The first routing pattern extends over the first barrier layer on the backside surface of the substrate and over the routing via. The first routing pattern is electrically connected to one end of the routing via and has a protrusion protruding towards the one end of the routing via in correspondence of the through hole. The second routing pattern extends over the second barrier layer on the frontside surface of the substrate. The second routing pattern directly contacts another end of the routing via. The semiconductor die is electrically connected to the routing via by the first routing pattern.

In accordance with some embodiments of the disclosure, a manufacturing method of a semiconductor package includes the following steps. Material is ablated from a first surface of a substrate to form a through hole in the substrate. The through hole opens at the first surface of the substrate and at a second surface opposite to the first surface. An end of the through hole at the second surface of the substrate is plugged. A first barrier material is sputtered on the substrate, from the side of the first surface. The first barrier material is deposited on sidewalls and at the end of the plugged through hole. A first seed material is sputtered on the first barrier material. A first conductive material is plated on the first seed material while the through hole is still plugged. The through hole is unplugged to reveal at least a portion of the first barrier material at the end of the through hole. The portion of the first barrier material at the end of the through hole is etched. A second conductive material is plated on an opposite side of the first seed material with respect to the first conductive material.

In accordance with some embodiments of the disclosure, a manufacturing method of a semiconductor package includes the following steps. A first barrier material is sputtered on a substrate having through holes extending from a frontside surface to a backside surface of the substrate. The first barrier material reaches the substrate from the direction of the frontside surface. A backside film is bonded to the backside surface of the substrate before depositing the first barrier material. One end of the through holes is closed by the backside film. A first seed material is sputtered on the first barrier material. The first seed material reaches the substrate from the direction of the frontside surface. A first conductive material is disposed on the sputtered first seed material after the backside film is bonded to the substrate. The first conductive material is disposed in the through holes and over the frontside surface of the substrate to form patterned conductive traces. The backside film is removed after the first conductive material is deposited. Portions of the first barrier material in correspondence of the through holes are removed from the side of the backside surface of the substrate, while other portions of the first barrier material remain on the frontside surface of the substrate and along sidewalls of the through holes. A second conductive material is disposed to form routing patterns where the portions of the first barrier material have been removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a substrate, having a through hole formed therethrough, wherein the through hole has a tapered profile, being wider at a frontside surface of the substrate than at a backside surface of the substrate opposite to the frontside surface;
a first barrier layer extending on the backside surface of the substrate;
a second barrier layer, extending along tapered sidewalls of the through hole and on the frontside surface of the substrate;
a routing via, filling the through hole and separated from the tapered sidewalls of the through hole by at least the second barrier layer;
a first routing pattern, extending over the first barrier layer on the backside surface of the substrate and further extending over the routing via, electrically connected to one end of the routing via, and having a protrusion protruding towards the one end of the routing via in correspondence of the through hole;
a second routing pattern, extending over the second barrier layer on the frontside surface of the substrate, wherein the second routing pattern directly contacts another end of the routing via; and
a semiconductor die, electrically connected to the routing via by the first routing pattern.

2. The semiconductor package of claim 1, further comprising a seed layer extending over the frontside surface of the substrate on the second barrier layer and between the protrusion of the first routing pattern and the routing via.

3. The semiconductor package of claim 2, wherein, in correspondence of the through hole, the seed layer directly contacts the one end of the routing via at one side and the first routing pattern at an opposite side.

4. The semiconductor package of claim 1, wherein the first barrier layer further extends on the tapered sidewalls of the through hole, in between the tapered sidewalls of the through holes and the second barrier layer.

5. The semiconductor package of claim 1, wherein the first barrier layer further extends between the routing via and the protrusion of the first routing pattern on the one end of the routing via.

6. The semiconductor package of claim 5, wherein a section of the first barrier layer extending between the routing via and the protrusion of the first routing pattern is sunken with respect to another section of the first barrier layer extending on the backside surface of the substrate.

7. The semiconductor package of claim 6, further comprising:
- a first seed layer, extending on the first barrier layer between the first barrier layer and the first routing pattern; and
- a second seed layer, extending on the second barrier layer over the frontside surface of the substrate and along the sidewalls of the through holes,
- wherein the first seed layer comprises a section which is sunken with respect to another section of the first seed layer, the other section of the first seed layer extends on the first barrier layer over the backside surface of the substrate, and the second barrier layer contacts the sidewalls of the through holes.

* * * * *